(12) United States Patent
Bong et al.

(10) Patent No.: US 12,178,129 B2
(45) Date of Patent: Dec. 24, 2024

(54) POWER GENERATING APPARATUS

(71) Applicant: LG INNOTEK CO., LTD., Seoul (KR)

(72) Inventors: Sang Hoon Bong, Seoul (KR); Un Hak Lee, Seoul (KR); Sung Chul Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 16/952,533

(22) Filed: Nov. 19, 2020

(65) Prior Publication Data

US 2021/0167269 A1 Jun. 3, 2021

(30) Foreign Application Priority Data

Dec. 3, 2019 (KR) .................. 10-2019-0159249

(51) Int. Cl.
*H10N 10/17* (2023.01)
*H10N 10/13* (2023.01)
*H10N 10/817* (2023.01)

(52) U.S. Cl.
CPC ............. *H10N 10/17* (2023.02); *H10N 10/13* (2023.02); *H10N 10/817* (2023.02)

(58) Field of Classification Search
CPC ......... H01L 35/08; H01L 35/30; H01L 35/32; H10N 10/13; H10N 10/17; H10N 10/817
See application file for complete search history.

(56) References Cited

U.S. PATENT DOCUMENTS

| 6,345,507 B1 | 2/2002 | Gillen | |
|---|---|---|---|
| 2002/0062649 A1 | 5/2002 | Ohkubo et al. | |
| 2006/0289051 A1 | 12/2006 | Niimi et al. | |
| 2012/0042640 A1* | 2/2012 | Limbeck | F01N 5/025 60/320 |
| 2013/0186445 A1* | 7/2013 | Lorimer | H01L 35/32 136/201 |

(Continued)

FOREIGN PATENT DOCUMENTS

| EP | 3352367 | 7/2018 |
|---|---|---|
| EP | 3 605 624 A1 | 2/2020 |

(Continued)

OTHER PUBLICATIONS

European Search Report dated Apr. 8, 2021 issued in Application No. 20209027.0.

(Continued)

*Primary Examiner* — Tamir Ayad
(74) *Attorney, Agent, or Firm* — KED & ASSOCIATES, LLP

(57) ABSTRACT

A power generating apparatus according to one embodiment of the present invention includes a duct through which a first fluid passes, a first thermoelectric module and a second thermoelectric module disposed on a first surface of the duct to be spaced apart from each other, a connector disposed between the first thermoelectric module and the second thermoelectric module on the first surface of the duct, and a shield member disposed on the connector on the first surface of the duct, wherein the shield member includes a first face and a second face having a height higher than a height of the first face.

13 Claims, 20 Drawing Sheets

(56) References Cited

U.S. PATENT DOCUMENTS

| | | | | |
|---|---|---|---|---|
| 2013/0199593 A1* | 8/2013 | Higashida | ............... | H01L 35/32 |
| | | | | 136/230 |
| 2013/0340801 A1* | 12/2013 | Zhang | .................... | H10N 10/13 |
| | | | | 136/212 |
| 2019/0323404 A1 | 10/2019 | Seon et al. | | |
| 2021/0074901 A1 | 3/2021 | Jeon et al. | | |

FOREIGN PATENT DOCUMENTS

| | | |
|---|---|---|
| EP | 3723144 | 10/2020 |
| GB | 2145876 | 4/1985 |
| JP | 2007-036178 A | 2/2007 |
| JP | 2012-521084 | 9/2012 |
| JP | 2013-207664 A | 10/2013 |
| JP | 2014-207837 | 10/2024 |
| WO | WO 2014/170738 | 10/2014 |
| WO | WO 2018/174173 A | 9/2018 |
| WO | WO 2019/112288 | 6/2019 |
| WO | WO 2019/194595 | 10/2019 |

OTHER PUBLICATIONS

Korean Office Action dated Nov. 29, 2023 issued in Application No. 10-2019-0159249.
Japanese Office Action dated Oct. 1, 2024 issued in Application 2020-196965.
Taiwanese Office Action dated Sep. 18, 2024, issued in Application No. 109141849.

* cited by examiner

[FIG. 1]
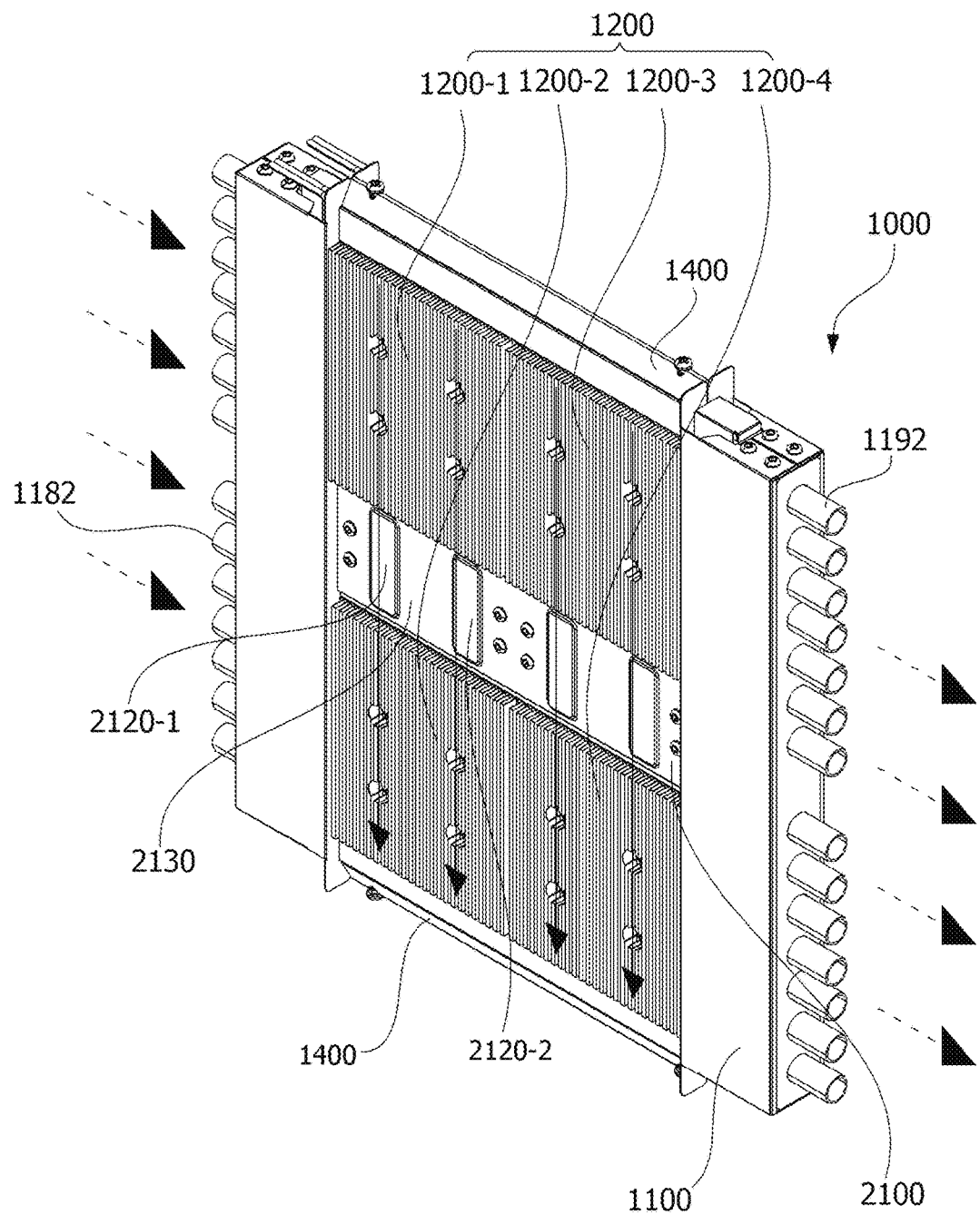

[FIG. 2]
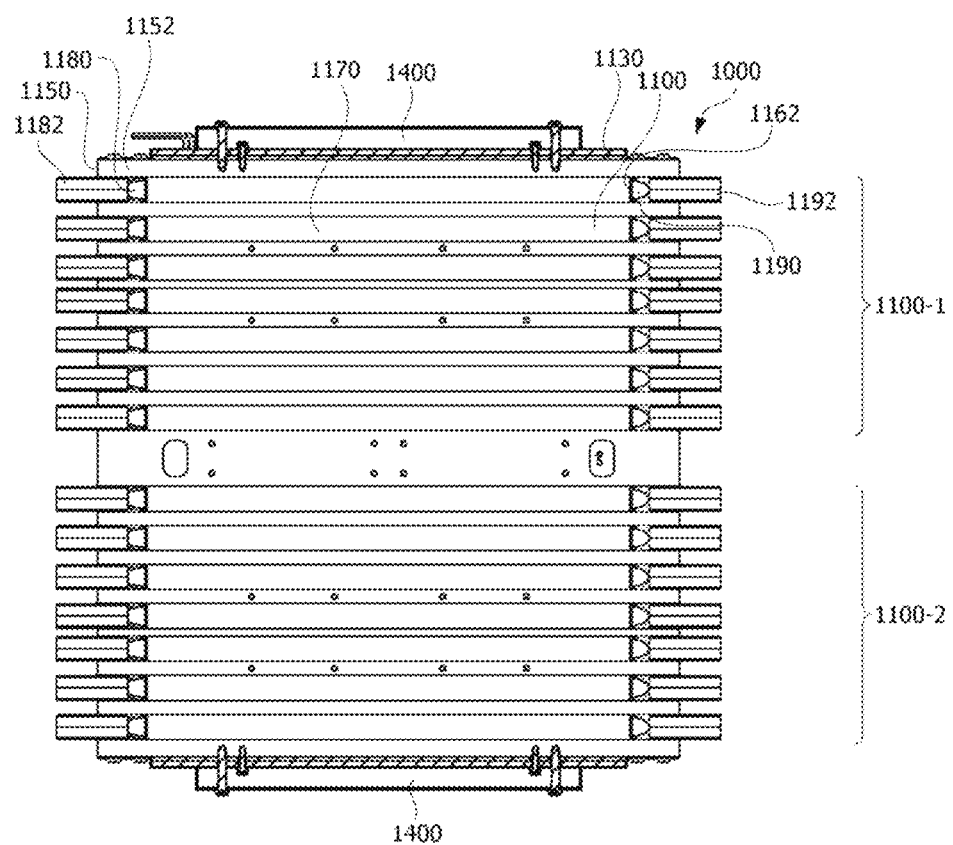

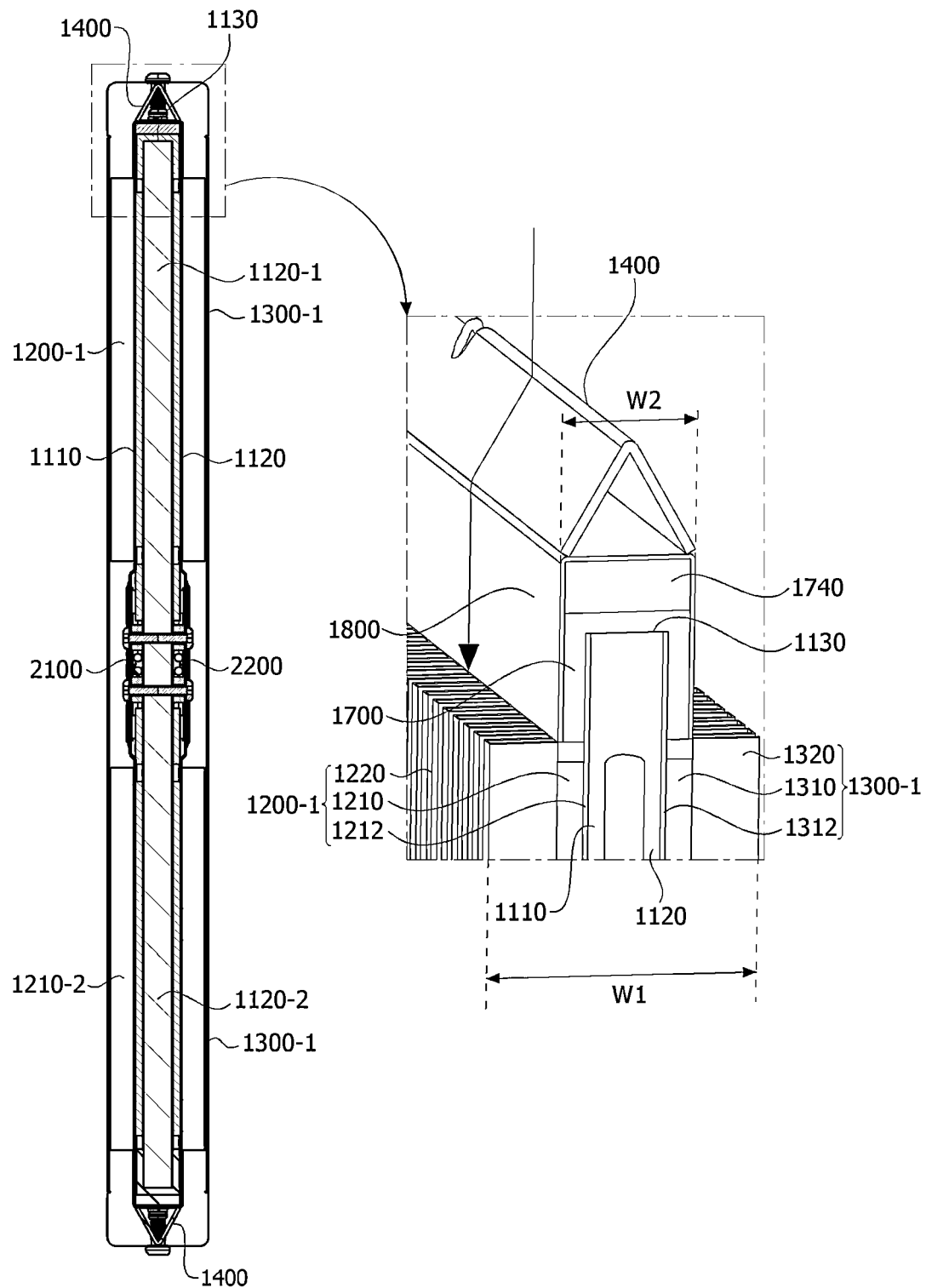
[FIG. 3]

[FIG. 4]
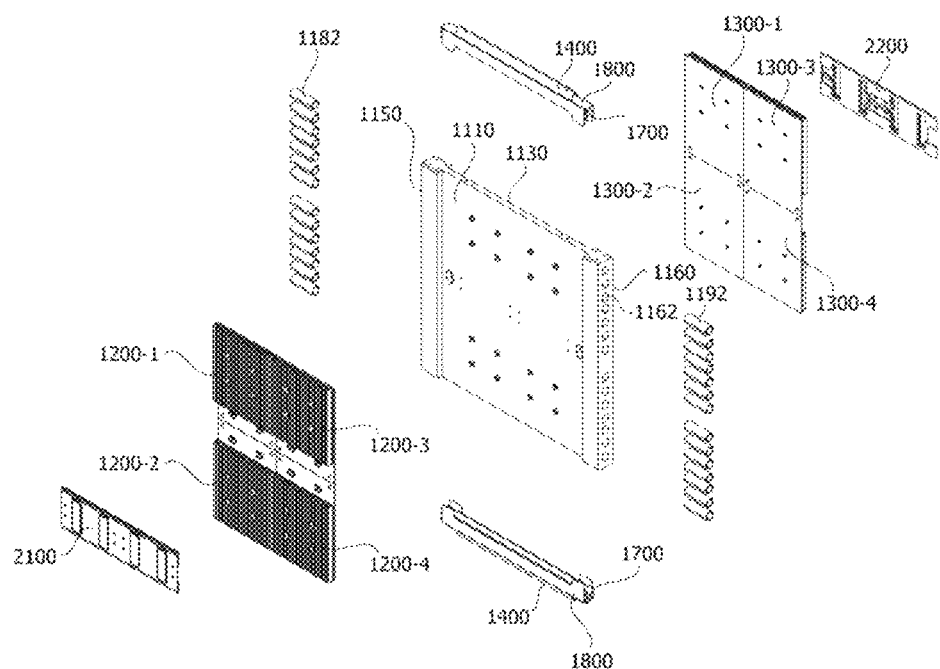

[FIG. 5]
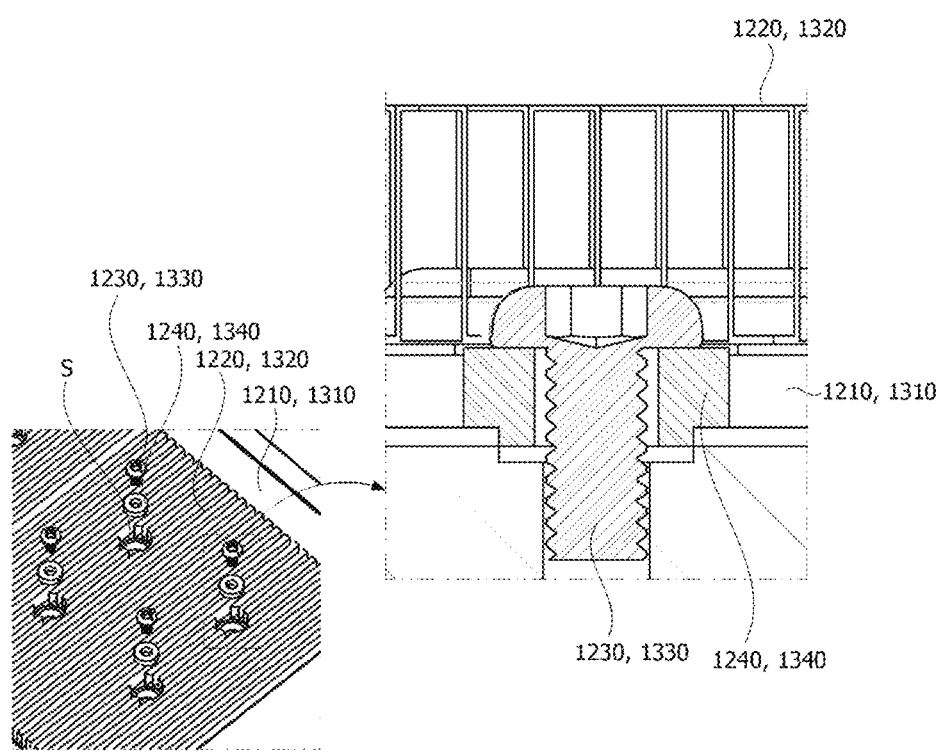

[FIG. 6]
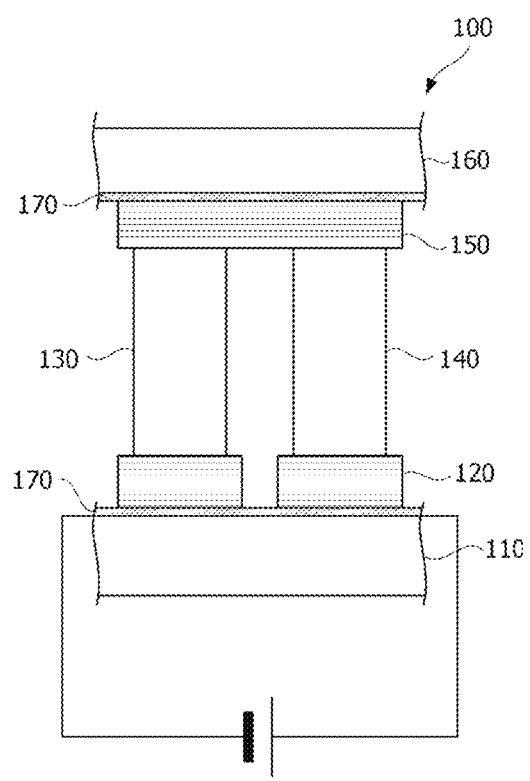

[FIG. 7]
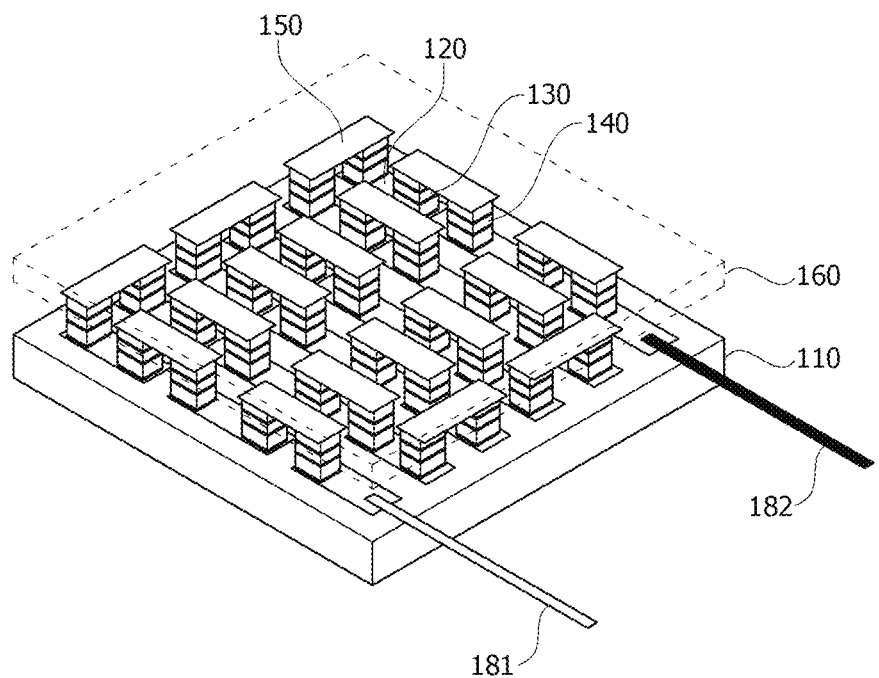

[FIG. 8]
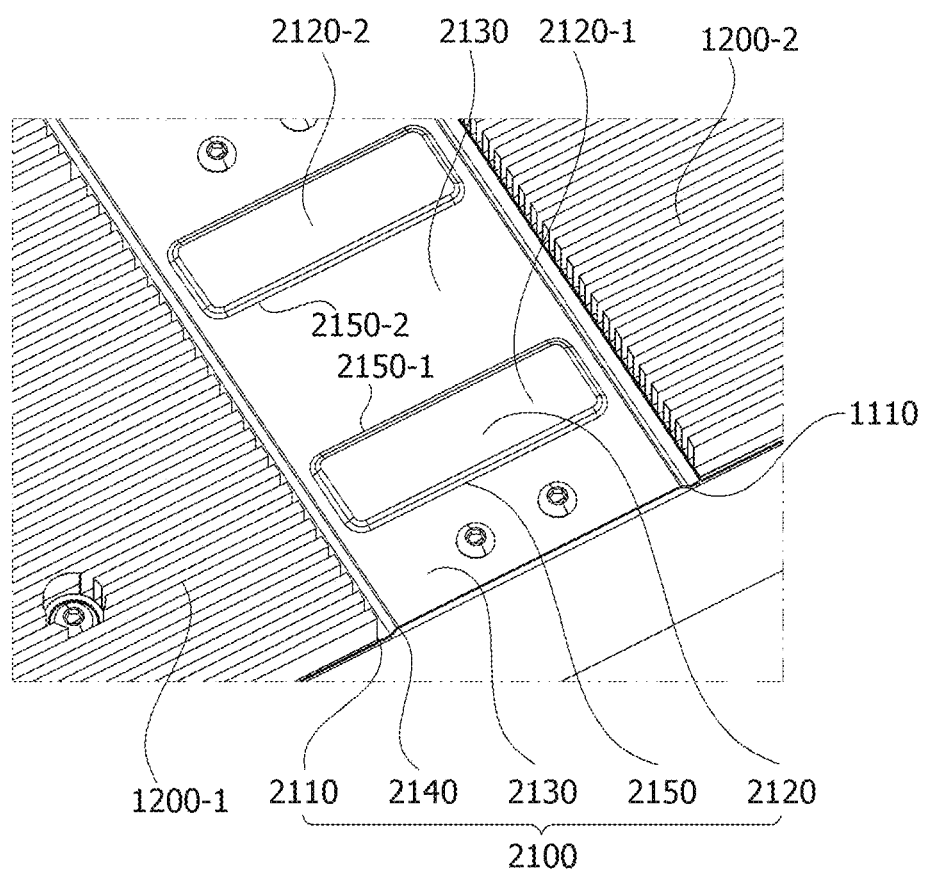

[FIG. 9]
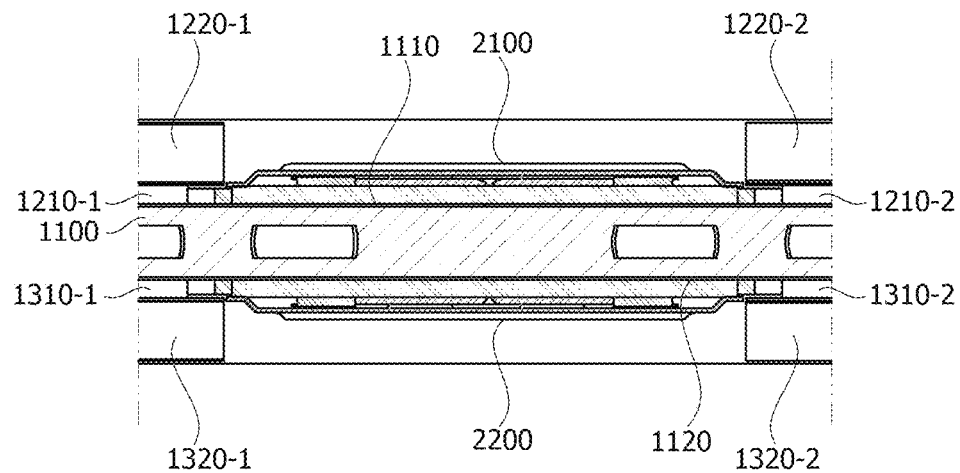
[FIG. 10]
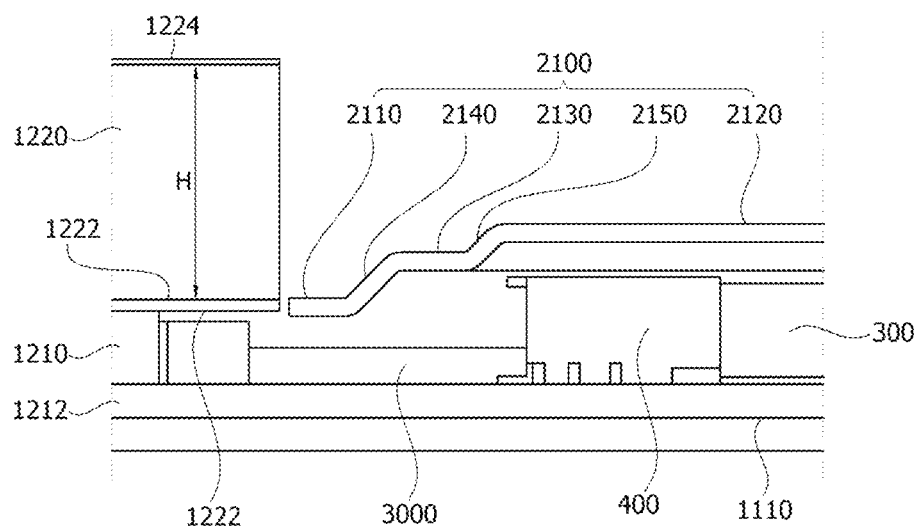

[FIG. 11]
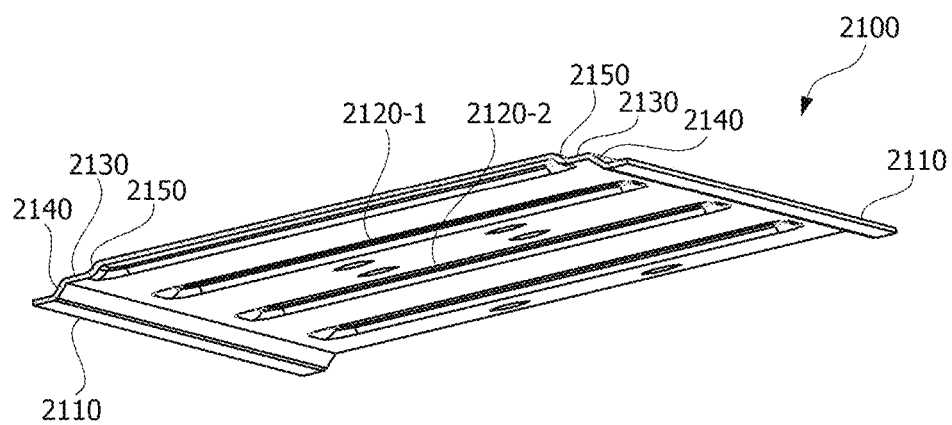

[FIG. 12]
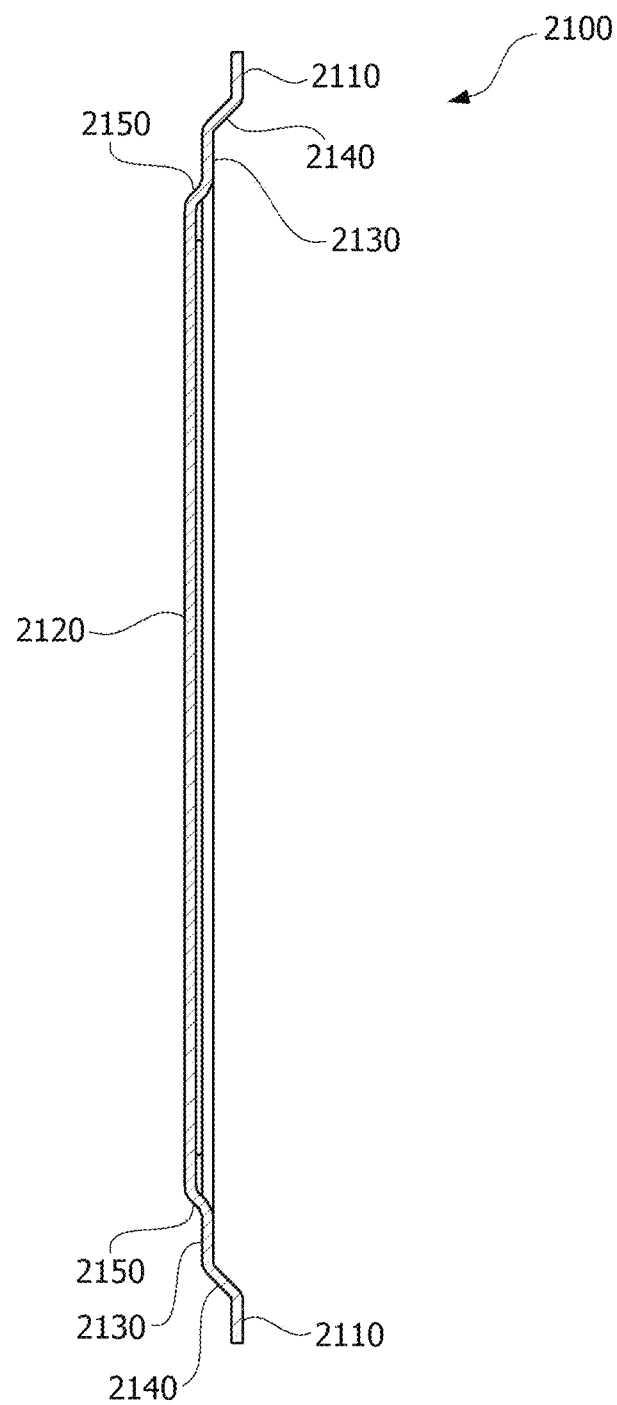

[FIG. 13A]
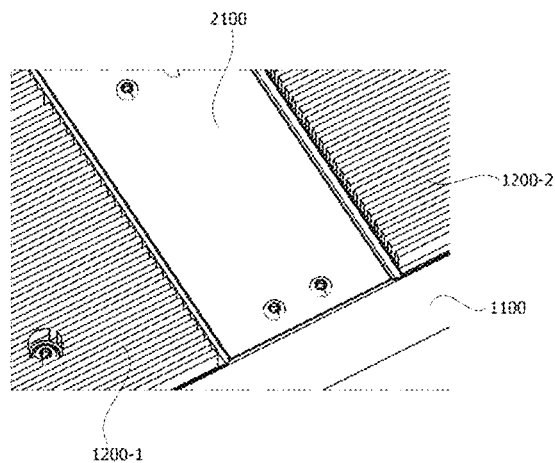
[FIG. 13B]
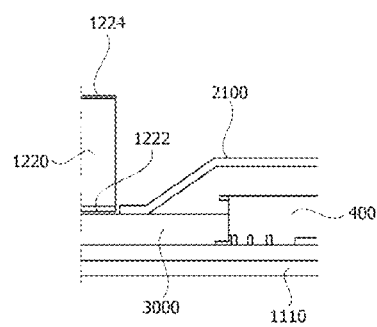
[FIG. 14]
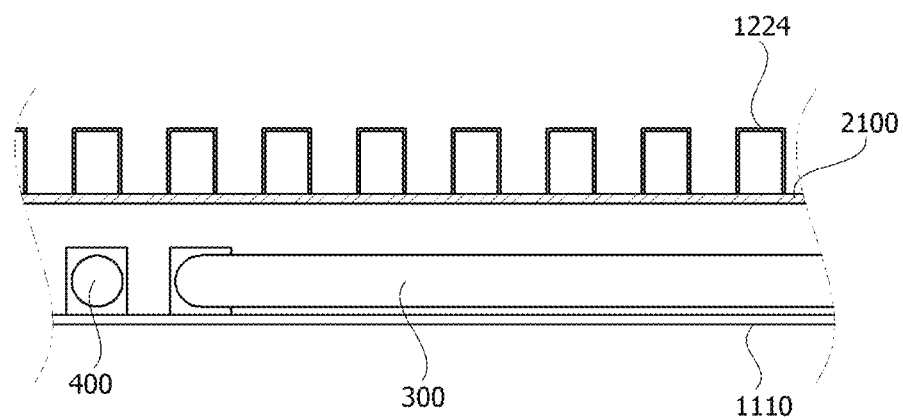

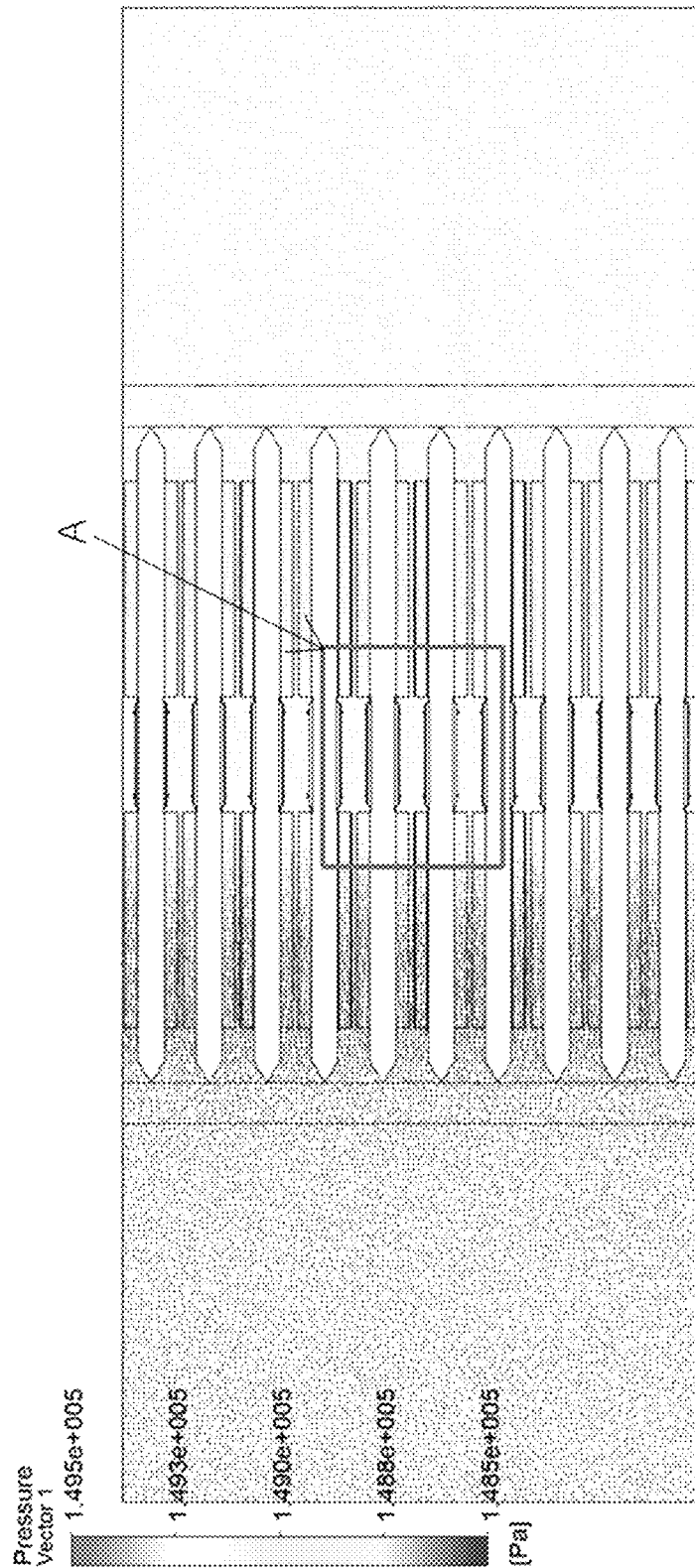
[FIG. 15A]

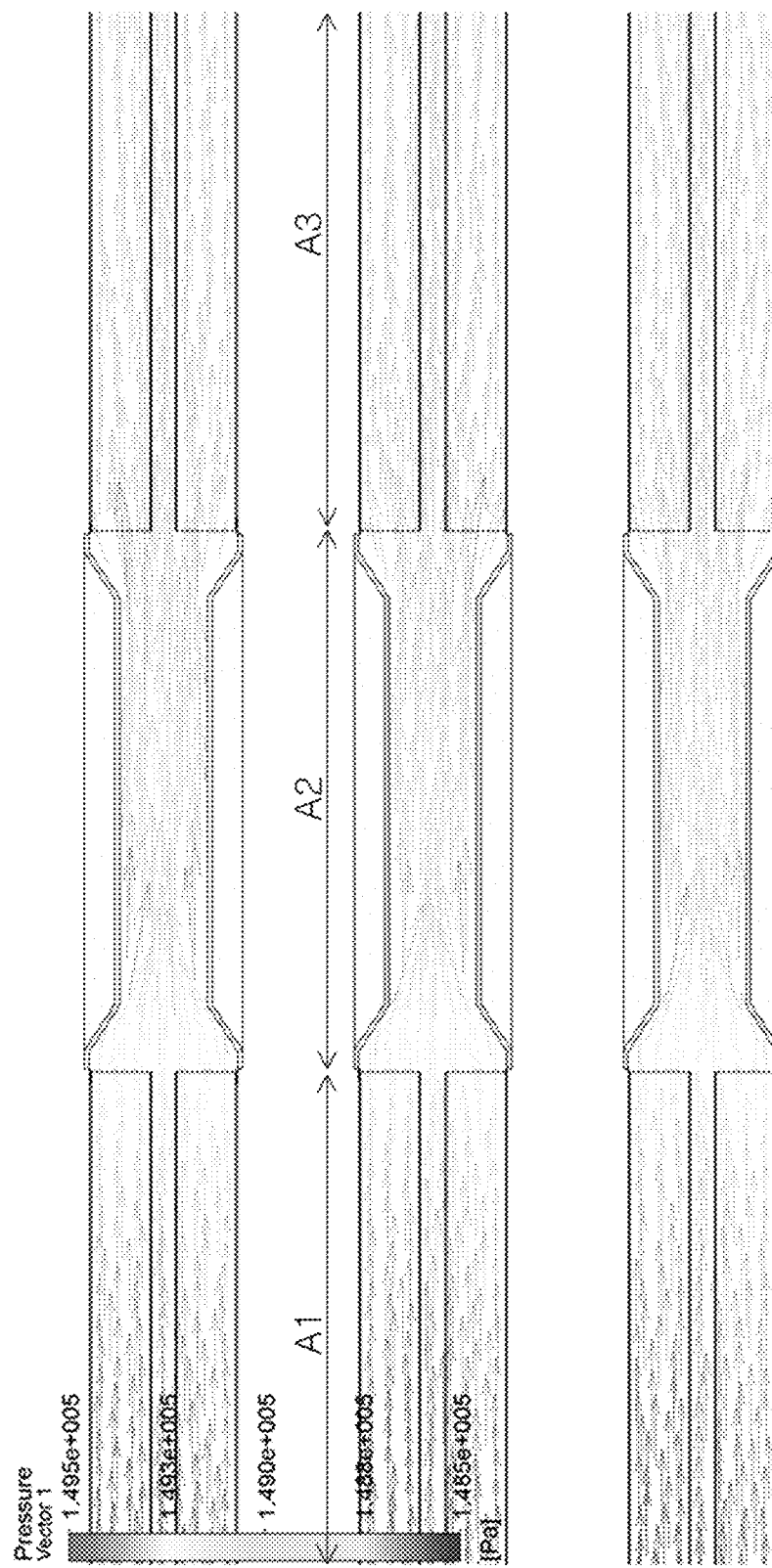
[FIG. 15B]

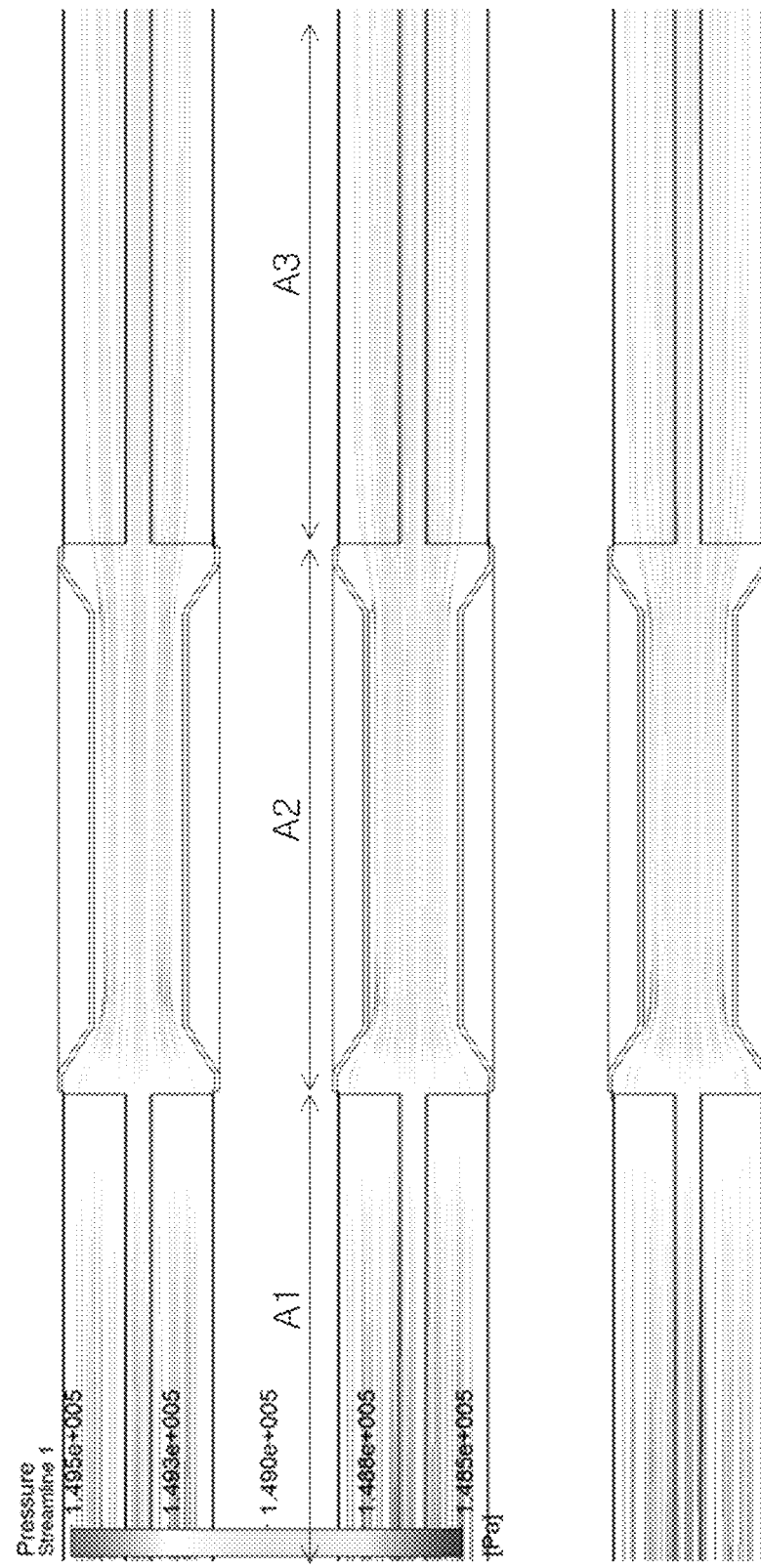
[FIG. 15C]

[FIG. 16A]
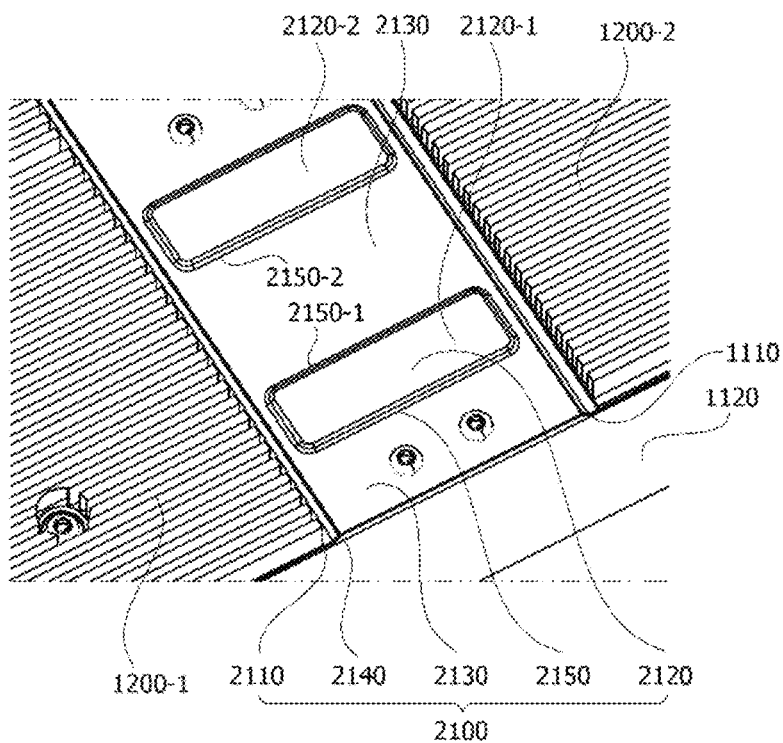
[FIG. 16B]
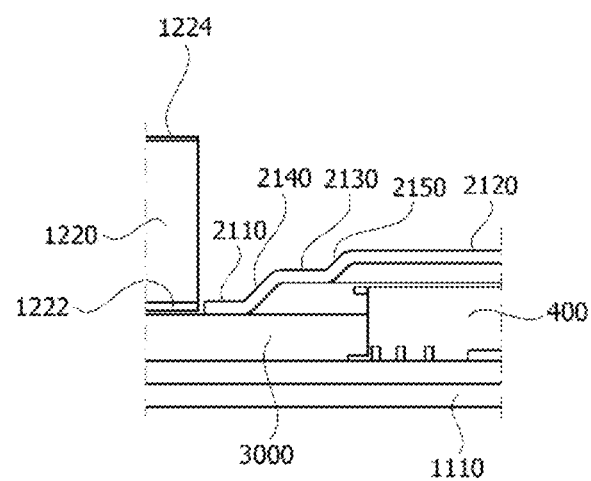

[FIG. 17]
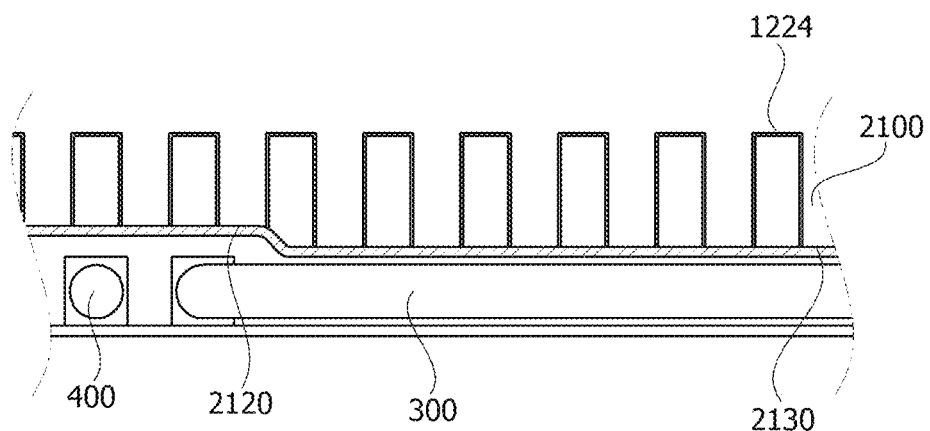

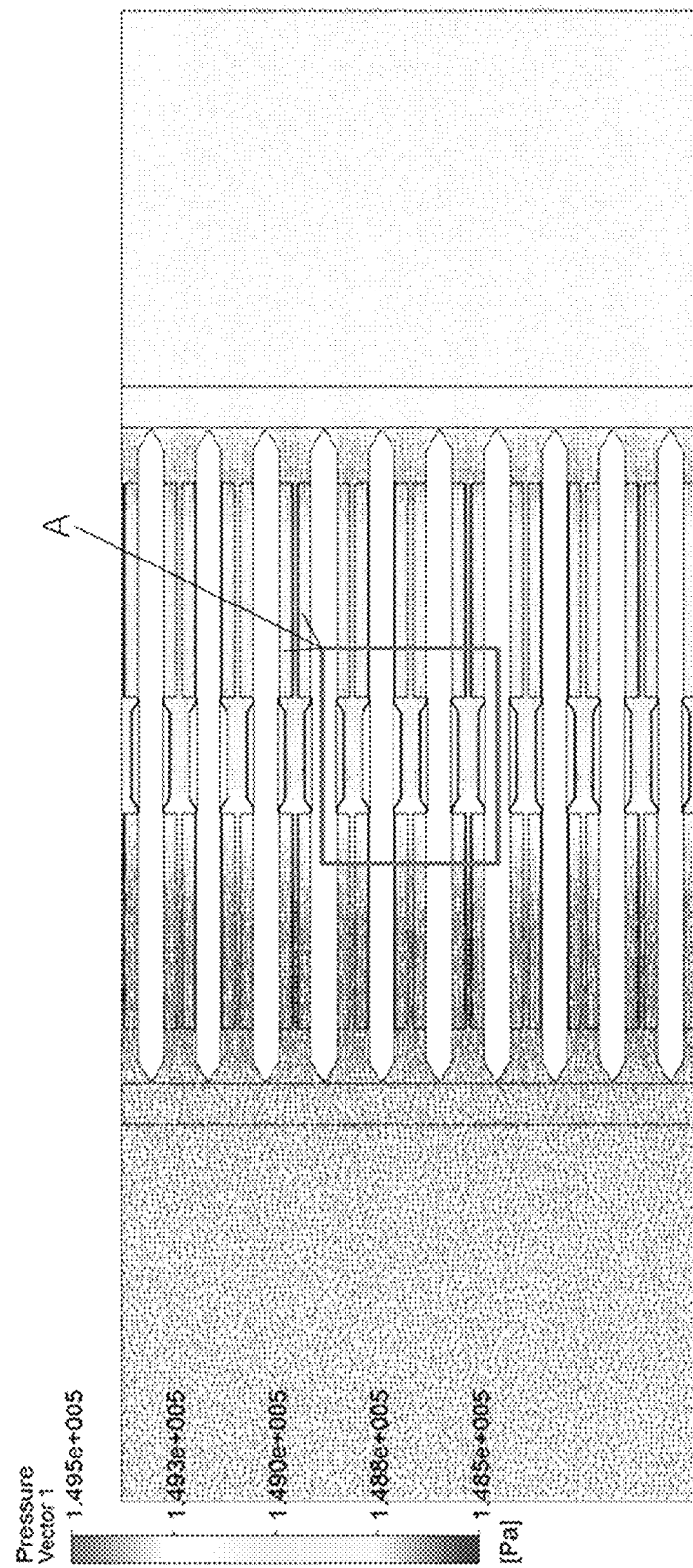
[FIG. 18A]

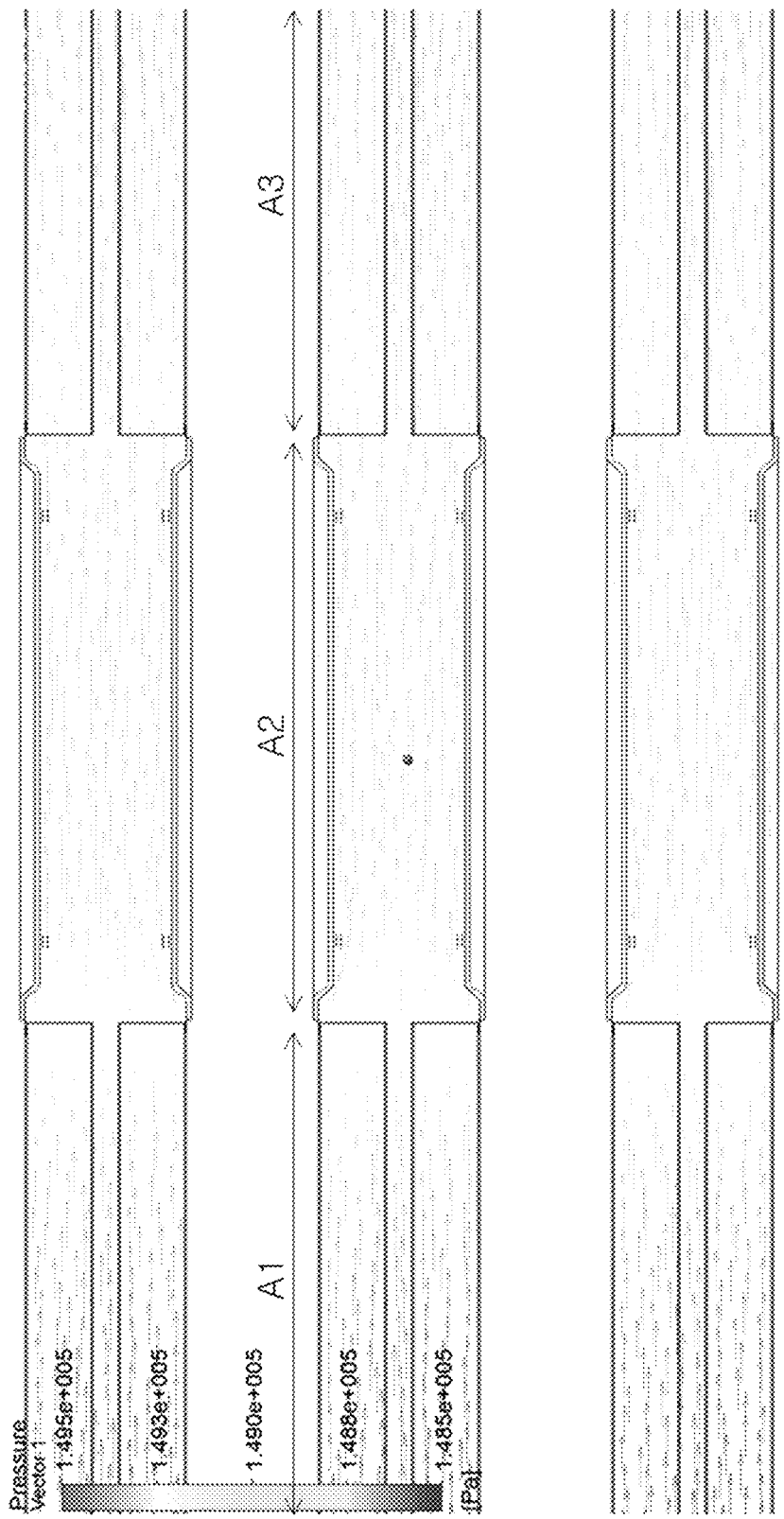
[FIG. 18B]

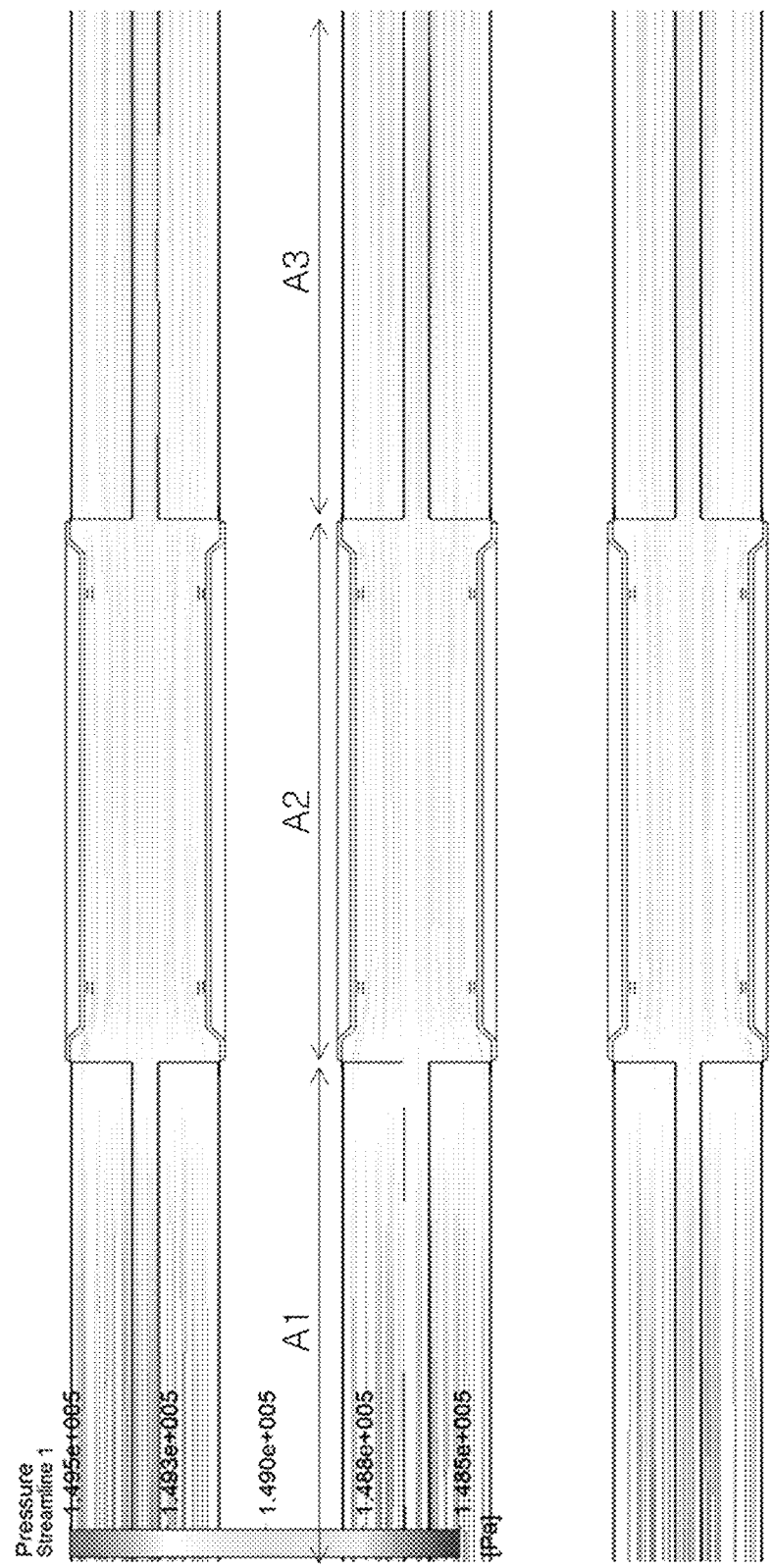
[FIG. 18C]

ic materials are disposed between and bonded to
POWER GENERATING APPARATUS

CROSS-REFERENCE TO RELATED APPLICATION

This application claims priority to and the benefit of Korean Patent Application No. 10-2019-0159249, filed on Dec. 3, 2019, the disclosure of which is incorporated herein by reference in its entirety.

BACKGROUND

1. Field of the Invention

The present invention relates to a power generating apparatus, and more specifically, to a power generating apparatus which generates electricity using a temperature difference between a low temperature portion and a high temperature portion of a thermoelectric device.

2. Discussion of Related Art

A thermoelectric effect is a phenomenon occurring due to the movement of electrons and holes in a material and means direct energy conversion between heat and electricity.

A thermoelectric device is a generic term of devices in which the thermoelectric effect is used and has a structure in which a P-type thermoelectric material and an N-type thermoelectric material are disposed between and bonded to metal electrodes to form a PN junction pair.

Thermoelectric devices may be divided into devices which use a change in electrical resistance according to a change in temperature, devices which use the Seebeck effect in which an electromotive force is generated due to a temperature difference, and devices which use the Peltier effect in which heating or heat absorption occurs due to current.

The thermoelectric devices have been variously applied to home appliances, electronic components, communication components, and the like. For example, the thermoelectric devices may be applied to cooling apparatuses, heating apparatuses, power generating apparatuses, and the like. Therefore, the demand for thermoelectric performance of the thermoelectric devices is gradually increasing.

Recently, there are needs to generate electricity using high temperate waste heat generated from engines of vehicles, vessels, and the like and thermoelectric devices. In this case, a duct through which a first fluid passes may be disposed at a side of a low temperature portion of the thermoelectric device, a radiation fin may be disposed at a side of a high temperature portion of the thermoelectric device, and a second fluid may pass through the radiation fin. Accordingly, electricity may be generated due to a temperature difference between the low temperature portion and the high temperature portion of the thermoelectric device, and electricity generation performance may depend on a structure of a power generating apparatus.

SUMMARY OF THE INVENTION

The present invention is directed to providing a power generating apparatus which generates electricity using a temperature difference between a low temperature portion and a high temperature portion of a thermoelectric device.

According to an aspect of the present invention, there is provided a power generating apparatus including a duct through which a first fluid passes, a first thermoelectric module and a second thermoelectric module disposed on a first surface of the duct to be spaced apart from each other, a connector disposed between the first thermoelectric module and the second thermoelectric module on the first surface of the duct, and a shield member disposed on the connector on the first surface of the duct, wherein the shield member includes a first face and a second face having a height higher than a height of the first face.

Each of the first thermoelectric module and the second thermoelectric module may include a thermoelectric device disposed on the first surface and a radiation fin disposed on the thermoelectric device, and an upper surface of the first face may be disposed at a height lower than or equal to a height of a lower surface of the radiation fin.

An electrical wire drawn out from at least one of the thermoelectric device of the first thermoelectric module and the thermoelectric device of the second thermoelectric module may be connected to the connector, and a lower surface of the second face may be disposed at a height higher than a height of the electrical wire and a height of the connector.

The shield member may further include a third face disposed between the first face and the second face and having a height higher than the height of the first face and lower than the height of the second face.

The third face may be disposed at the height higher than the height of the electrical wire, and the second face may be disposed at the height higher than the height of the connector.

The shield member may further include a first connecting face connecting the upper surface of the first face and an upper surface of the third face and a second connecting face connecting the upper surface of the third face and an upper surface of the second face, and the first connecting face may be inclined at an angle greater than 0° and less than 90° with respect to the upper surface of the first face.

The first face of the shield member may be symmetrically disposed between the first thermoelectric module and the second thermoelectric module.

An area of the third face may be greater than an area of the second face.

The shield member may include a plurality of second faces which are identical to the second face and spaced apart from each other.

The third face may be disposed between two second faces spaced apart from each other, and the second connecting face may be symmetrically disposed to connect the upper surface of the second face and the upper surface of the third face.

The power generating apparatus may further include an insulating member disposed between the first surface and a lower surface of the shield member.

The insulating member may be disposed on side surfaces of the electrical wire and the connector on the first surface.

The insulating member may not be disposed on at least a portion between the electrical wire and the lower surface of the shield member and between the connector and the lower surface of the shield member.

An upper surface of the second face may be disposed to have a maximum height, which is 0.25 times a height difference between the lower surface of the radiation fin and an upper surface of the radiation fin, from the lower surface of the radiation fin.

A temperature of a second fluid sequentially passing through the radiation fin of the first thermoelectric module, an upper surface of the shield member, and the radiation fin of the second thermoelectric module may be different from a temperature of the first fluid.

A flow direction of the first fluid may be different from a flow direction of the second fluid.

The flow direction of the first fluid may be perpendicular to the flow direction of the second fluid.

The duct may include a first duct and a second duct adjacent to the first duct, and the shield member may be disposed between the first thermoelectric module disposed on the first surface of the first duct and the first thermoelectric module disposed on the first surface of the second duct.

According to another aspect of the present invention, there is provided a power generating apparatus including a duct through which a first fluid passes, a first thermoelectric module and a second thermoelectric module disposed on a first surface of the duct to be spaced apart from each other, a first connector disposed between the first thermoelectric module and the second thermoelectric module on the first surface of the duct, a first shield member disposed on the first connector on the first surface of the duct, a third thermoelectric module and a fourth thermoelectric module disposed on a second surface facing the first surface of the duct to be spaced apart from each other, a second connector disposed between the third thermoelectric module and the fourth thermoelectric module on the second surface of the duct, and a second shield member disposed on the second connector on the second surface of the duct, wherein each of the first shield member and the second shield member includes a first face and a second face having a height higher than a height of the first face.

Each of the first to fourth thermoelectric modules may include a thermoelectric device disposed on the corresponding surface of the duct and a radiation fin disposed on the thermoelectric device, and a distance between the surface of the duct and the first face may be less than or equal to a minimum distance between the surface of the duct and the radiation fin.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 1 is a perspective view illustrating a power generating apparatus according to one embodiment of the present invention;

FIG. 2 is one cross-sectional view illustrating the power generating apparatus of FIG. 1;

FIG. 3 is another cross-sectional view illustrating the power generating apparatus of FIG. 1;

FIG. 4 is an exploded perspective view illustrating the power generating apparatus of FIG. 1;

FIG. 5 is a partially enlarged view illustrating the power generating apparatus of FIG. 1;

FIG. 6 is a cross-sectional view illustrating a thermoelectric device;

FIG. 7 is a perspective view illustrating the thermoelectric device;

FIG. 8 is a partial perspective view illustrating the power generating apparatus including a shield member according to one embodiment of the present invention;

FIG. 9 is a cross-sectional view illustrating the power generating apparatus of FIG. 8;

FIG. 10 is an enlarged view illustrating a vicinity of the shield member of the power generating apparatus of FIG. 8;

FIG. 11 is a perspective view illustrating the shield member according to one embodiment of the present invention;

FIG. 12 is a cross-sectional view illustrating the shield member according to one embodiment of the present invention;

FIGS. 13A and 13B are a set of a top view and a cross-sectional view illustrating a shield member according to a comparative example;

FIG. 14 is a view illustrating a height difference between the shield member and a radiation fin according to the comparative example of FIG. 13;

FIGS. 15A to 15C are views illustrating a flow of a gas passing through the shield member according to the comparative example;

FIGS. 16A and 16B are a set of a top view and a cross-sectional view illustrating the shield member according to the embodiment of the present invention;

FIG. 17 is a view illustrating a height difference between the shield member and a radiation fin according to the embodiment of FIG. 16; and FIGS. 18A to 18C are views illustrating a flow of a fluid passing through the shield member according to the embodiment of FIG. 16.

DETAILED DESCRIPTION OF EXEMPLARY EMBODIMENTS

Hereinafter, exemplary embodiments of the present invention will be described in more detail with reference to the accompanying drawings.

However, the technical spirit of the present invention is not limited to some embodiments which will be described and may be realized using various other embodiments, and at least one component of the embodiments may be selectively coupled, substituted, and used to realize the technical spirit within the range of the technical spirit.

In addition, unless clearly and specifically defined otherwise by context, all terms (including technical and scientific terms) used herein can be interpreted as having customary meanings to those skilled in the art, and meanings of generally used terms, such as those defined in commonly used dictionaries, will be interpreted in consideration of contextual meanings of the related technology.

In addition, the terms used in the embodiments of the present invention are considered in a descriptive sense and not to limit the present invention.

In the present specification, unless clearly indicated otherwise by the context, singular forms include the plural forms thereof, and in a case in which "at least one (or one or more) among A, B, and C" is described, this may include one or more of all combinations which can be combined with A, B, and C.

In descriptions of the components of the present invention, terms such as "first," "second," "A," "B," "a," and "b" can be used.

The terms are only to distinguish one element from another element, and an essence, order, and the like of the element are not limited by the terms.

It should be understood that, when an element is referred to as being "connected or coupled" to another element, such a description may include both a case in which the element is directly connected or coupled to another element, and a case in which the element is connected or coupled to another element with still another element disposed therebetween.

In a case in which any one element is described as being formed or disposed "on or under" another element, such a description includes both a case in which the two elements are formed or disposed to be in direct contact with each other and a case in which one or more other elements are disposed between the two elements. In addition, when one element is described as being formed "on or under" another element, such a description may include a case in which the one element is formed at an upper side or a lower side with respect to another element.

FIG. 1 is a perspective view illustrating a power generating apparatus according to one embodiment of the present invention, FIG. 2 is one cross-sectional view illustrating the power generating apparatus of FIG. 1, FIG. 3 is another cross-sectional view illustrating the power generating apparatus of FIG. 1, FIG. 4 is an exploded perspective view illustrating the power generating apparatus of FIG. 1, and FIG. 5 is a partially enlarged view illustrating the power generating apparatus of FIG. 1.

Referring to FIGS. 1 to 4, a power generating apparatus 1000 includes a duct 1100, a first thermoelectric module 1200, a second thermoelectric module 1300, and a gas guide member 1400. A plurality of power generating apparatuses 1000 may be disposed in parallel at predetermined intervals to form an electricity generation system. Although not illustrated in the drawings, a second fluid may pass between two power generating apparatuses 1000 disposed to be spaced apart from each other at the predetermined interval. For example, the second thermoelectric module 1300 of one power generating apparatus 1000 and the first thermoelectric module 1200 of another adjacent power generating apparatus 1000 are disposed in parallel to be spaced apart from each other at the predetermined interval, and the second fluid may pass therebetween.

The power generating apparatus 1000 according to the embodiment of the present invention may generate electricity using a temperature difference between a first fluid flowing in the duct 1100 and the second fluid passing outside the duct 1100. In the present specification, a temperature of the first fluid flowing in the duct 1100 may be lower than a temperature of the second fluid passing radiation fins of the thermoelectric modules 1200 and 1300 disposed outside the duct 1100. In the present specification, the first fluid may also be referred as a cooling fluid, and the second fluid may also be referred as a gas or high temperature fluid.

To this end, the first thermoelectric module 1200 may be disposed on one surface of the duct 1100 and the second thermoelectric module 1300 may be disposed on the other surface of the duct 1100. In this case, among both surfaces of each of the first thermoelectric module 1200 and the second thermoelectric module 1300, a surface facing the duct 1100 may become a low temperature portion thereof, and power may be generated using a temperature difference between the low temperature portion and a high temperature portion.

The first fluid introduced into the duct 1100 may be water but is not limited thereto and may be one of various fluids having cooling performance. A temperature of the first fluid introduced into the duct 1100 may be less than 100° C., preferably less than 50° C., and more preferably less than 40° C., but is not limited thereto. A temperature of the first fluid passing through and discharged from the duct 1100 may be higher than a temperature of the first fluid introduced into the duct 1100. The duct 1100 includes a first surface 1110, a second surface 1120 disposed to face the first surface 1110 in parallel, a third surface 1130 disposed between the first surface 1110 and the second surface 1120, and a fourth surface 1140 disposed between the first surface 1110 and the second surface 1120 and facing the third surface 1130, and the first fluid passes through the duct formed by the first surface 1110, the second surface 1120, the third surface 1130, and the fourth surface 1140. The first fluid is introduced through a first fluid inlet of the duct 1100 and discharged through a first fluid outlet thereof. An inlet flange (not shown) and an outlet flange (not shown) may be further respectively disposed at a side of the first fluid inlet of the duct 1100 and a side of the first fluid outlet thereof to facilitate introduction and discharge of the first fluid and support the duct 1100. Alternatively, a plurality of first fluid inlets 1152 may be formed in a fifth surface 1150 which is one surface of two surfaces between the first surface 1110, the second surface 1120, the third surface 1130, and the fourth surface 1140 of the duct 1100 and a plurality of first fluid outlets 1162 may be formed in a sixth surface 1160 which is the other surface of two surfaces between the first surface 1110, the second surface 1120, the third surface 1130, and the fourth surface 1140 thereof. The plurality of first fluid inlets 1152 and the plurality of first fluid outlets 1162 may be connected to a plurality of first fluid passing pipes 1170 in the duct 1100. Accordingly, the first fluid introduced through the first fluid inlets 1152 may pass through the first fluid passing pipes 1170 and be discharged through the first fluid outlets 1162. In this case, since the first fluid may be uniformly dispersed in the duct 1100 even when a flow rate of the first fluid is not sufficient to fully fill the duct 1100, or a surface area of the duct 1100 is large, uniform thermoelectric conversion efficiency may be obtained over the entire surface of the duct 1100, and the inlet flange and the outlet flange may be omitted.

In this case, the first fluid inlets 1152 may be connected to first fluid inlet pipes 1182 through first fitting members 1180, and the first fluid outlets 1162 may be connected to first fluid outlet pipes 1192 through second fitting members 1190.

In this case, the first fluid inlet pipes 1182 and the first fluid outlet pipes 1192 may be disposed to protrude from the fifth surface 1150 and the sixth surface 1160 of the duct 1100.

Although not illustrated in the drawings, radiation fins may be disposed on an inner wall of the duct 1100. The number, a shape, and an area, which occupies the inner wall of the duct 1100, of radiation fins may be variously changed according to a temperature of the first fluid, a temperature of waste heat, a required electricity generation capacity, and the like. For example, an area of the radiation fins occupying the inner wall of the duct 1100 may be in the range of 1 to 40% of a cross sectional area of the duct 1100. Accordingly, high thermoelectric conversion efficiency can be obtained even without interfering with a flow of the first fluid. In this case, the radiation fins may have a shape which does not interfere with the flow of the first fluid. For example, the radiation fins may be formed in a direction in which the first fluid flows. That is, the radiation fin may have a plate shape extending from the first fluid inlet in a direction toward the first fluid outlet, and the plurality of radiation fins may be disposed to be spaced apart from each other at predetermined intervals. The radiation fins may be integrally formed with the inner wall of the duct 1100.

According to the embodiment of the present invention, the duct 1100 may be provided as a plurality of ducts 1100. For example, the ducts 1100 may include a first duct 1100-1 and a second duct 1100-2 adjacent to the first duct 1100-1. Accordingly, since the first fluid may be uniformly dispersed in the first duct 1100-1 and the second duct 1100-2 even when a flow rate of the first fluid is not sufficient to fully fill the ducts 1100, uniform thermoelectric conversion efficiency can be obtained over the entire surface of the ducts 1100.

Meanwhile, the first thermoelectric module 1200 is disposed on the first surface 1110 of the duct 1100, the second thermoelectric module 1300 is disposed on the second surface 1120 of the duct 1100, and the first thermoelectric module 1200 and the second thermoelectric module 1300 are symmetrically disposed.

The first thermoelectric module 1200 and the second thermoelectric module 1300 may be coupled to the duct 1100 using screws. Accordingly, the first thermoelectric module 1200 and the second thermoelectric module 1300 may be stably coupled to the surfaces of the duct 1100. Alternatively, at least one of the first thermoelectric module 1200 and the second thermoelectric module 1300 may also be bonded to the surface of the duct 1100 using a thermal interface material (TIM) 1212 or 1312.

Meanwhile, the first thermoelectric module 1200 and the second thermoelectric module 1300 respectively include thermoelectric devices 1210 and 1310 disposed on the first surface 1110 and the second surface 1120 and radiation fins 1220 and 1320 disposed on the thermoelectric devices 1210 and 1310. In this case, a distance between the first surface 1110 and the first radiation fin 1220 may be greater than a distance between the first surface 1110 and the thermoelectric device 1210, and a distance between the second surface 1120 and the second radiation fin 1320 may be greater than a distance between the second surface 1120 and the thermoelectric device 1310. As described above, the duct 1100 in which the first fluid flows is disposed on one surface of both surfaces of each of the thermoelectric devices 1210 and 1310, the radiation fins 1220 and 1320 are disposed on the other surface of each thereof, and when the second fluid passes through the radiation fins 1220 and 1320, a temperature difference between heat absorbing surfaces and radiation surfaces of the thermoelectric devices 1210 and 1310 may be increased and thus thermoelectric conversion efficiency may be improved. In this case, the direction in which the first fluid flows and a direction in which the second fluid flows may be different. For example, the direction in which the first fluid flows is substantially perpendicular to the direction in which the second fluid flows.

In this case, referring to FIG. 5, the radiation fins 1220 and 1320 and the thermoelectric devices 1210 and 1310 may be coupled by a plurality of coupling members 1230 and 1330. To this end, through holes S, through which the coupling members 1230 and 1330 pass, may be formed in at least some of the radiation fins 1220 and 1320 and the thermoelectric devices 1210 and 1310. In this case, separate insulators 1240 and 1340 may be further disposed between the through holes S and the coupling members 1230 and 1330. The separate insulators 1240 and 1340 may be insulators surrounding outer circumferential surfaces of the coupling members 1230 and 1330 or insulators surrounding inner walls of the through holes S. Accordingly, insulation distances of the thermoelectric modules can be increased.

In this case, a structure of each of the thermoelectric devices 1210 and 1310 may have a structure of a thermoelectric device 100 illustrated in FIGS. 6 and 7. Referring to FIGS. 6 and 7, the thermoelectric device 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower surfaces of the P-type thermoelectric legs 130 and the N-type thermoelectric legs 140, and the upper electrodes 150 are disposed between the upper substrate 160 and upper surfaces of the P-type thermoelectric legs 130 and the N-type thermoelectric legs 140. Accordingly, the plurality of P-type thermoelectric legs 130 and the plurality of N-type thermoelectric legs 140 are electrically connected through the lower electrodes 120 and the upper electrodes 150. A pair of the P-type thermoelectric leg 130 and the N-type thermoelectric leg 140 disposed between the lower electrodes 120 and the upper electrode 150 and electrically connected to each other may form a unit cell.

For example, when a voltage is applied to the lower electrodes 120 and the upper electrodes 150 through lead wires 181 and 182, the substrate, through which a current flows from the P-type thermoelectric leg 130 to the N-type thermoelectric leg 140, may absorb heat to serve as a cooling portion due to the Peltier effect, and the substrate, through which a current flows from the N-type thermoelectric leg 140 to the P-type thermoelectric leg 130, may be heated to serve as a heating portion due to the Peltier effect. Alternatively, when a temperature difference is applied between the lower electrodes 120 and the upper electrodes 150, electric charges in the P-type thermoelectric leg 130 and the N-type thermoelectric leg 140 move to generate electricity due to the Seebeck effect.

In this case, the P-type thermoelectric leg 130 and the N-type thermoelectric leg 140 may be bismuth-telluride (Bi—Te)-based thermoelectric legs mainly containing Bi and Te. The P-type thermoelectric leg 130 may be a Bi—Te-based thermoelectric leg containing at least one among antimony (Sb), nickel (Ni), aluminum (Al), copper (Cu), silver (Ag), lead (Pb), boron (B), gallium (Ga), Te, Bi, and indium (In). For example, the P-type thermoelectric leg 130 may contain Bi—Sb—Te at 99 to 99.999 wt % which is a main material and at least one at 0.001 to 1 wt % among Ni, Al, Cu, Ag, Pb, B, Ga, and In with respect to a total weight of 100 wt %. The N-type thermoelectric leg 140 may be a Bi—Te-based thermoelectric leg containing at least one among Se, Ni, Al, Cu, Ag, Pb, B, Ga, Te, Bi, and In. For example, the N-type thermoelectric leg 140 may include Bi—Se—Te at 99 to 99.999 wt % which is the main material and at least one at 0.001 to 1 wt % among Ni, Al, Cu, Ag, Pb, B, Ga, and In with respect to a total weight of 100 wt %. Accordingly, in the present specification, the thermoelectric leg may also be referred to as a semiconductor structure, a semiconductor device, a semiconductor material layer, a conductive semiconductor structure, a thermoelectric structure, a thermoelectric material layer, and the like.

The P-type thermoelectric leg 130 and the N-type thermoelectric leg 140 may be formed as bulk type or stack type thermoelectric legs. Generally, the bulk type P-type thermoelectric leg 130 or bulk type N-type thermoelectric leg 140 may be formed through a process in which a thermoelectric material is heat-treated to manufacture an ingot, the ingot is grinded and screened to obtain a powder for a thermoelectric leg, the powder is sintered, and a sintered pellet is cut. In this case, the P-type thermoelectric leg 130 and the N-type thermoelectric leg 140 may be polycrystalline thermoelectric legs. When the powder for the thermoelectric leg is sintered to form the polycrystalline thermoelectric leg, the powder may be compressed by a pressure ranging from 100 MPa to 200 MPa. For example, when the sintering is performed for the P-type thermoelectric leg 130, the powder for the thermoelectric leg may be sintered at 100 to 150 MPa, preferably at 110 to 140 MPa, and more preferably at 120 to 130 MPa. In addition, when the powder for the N-type thermoelectric leg 140 is sintered, the powder for the thermoelectric leg may be sintered at 150 to 200 MPa, preferably at 160 to 195 MPa, and more preferably at 70 to 190 MPa. As described above, in the case in which the P-type thermoelectric leg 130 and the N-type thermoelectric leg 140 are the polycrystalline thermoelectric legs, strengths of the P-type thermoelectric leg 130 and the N-type thermoelectric leg 140 may be increased. The stack type P-type thermoelectric leg 130 or stack type N-type thermoelectric leg 140 may be formed in a process of coating a sheet-shaped base with a paste including a thermoelectric material to form unit members and a process of stacking and cutting the unit members.

In this case, the pair of the P-type thermoelectric leg 130 and the N-type thermoelectric leg 140 may have the same shape and volume or may have different shapes and volumes. For example, since electrical conduction properties of the P-type thermoelectric leg 130 and the N-type thermoelectric leg 140 are different, a height or cross sectional area of the N-type thermoelectric leg 140 may be different from that of the P-type thermoelectric leg 130.

In this case, the P-type thermoelectric leg 130 or N-type thermoelectric leg 140 may have a cylindrical shape, a polygonal column shape, an elliptical column shape, or the like.

Performance of the thermoelectric device according to one embodiment of the present invention may be expressed as a figure of merit (ZT). The figure of merit (ZT) may be expressed by Equation 1.

[Equation 1]

$$ZT = \alpha 2 \cdot \sigma \cdot T/k$$

Here, $\alpha$ is the Seebeck coefficient [V/K], $\sigma$ is electric conductivity [S/m], and $\alpha 2 \cdot \sigma$ is power factor [W/mK2]. In addition, T is temperature, and k is thermal conductivity [W/mK]. k may be expressed as $a \cdot cp \cdot \rho$, and a is thermal diffusivity [cm2/S], cp is specific heat [J/gK], and $\rho$ is density [g/cm3].

In order to obtain a figure of merit of a thermoelectric element, a Z value [V/K] is measured using a Z meter, and thus the figure of merit (ZT) may be calculated using the measured Z value.

Here, each of the lower electrodes 120 disposed between the lower substrate 110 and the P-type and N-type thermoelectric legs 130 and 140 and the upper electrode 150 disposed between the upper substrate 160 and the P-type and N-type thermoelectric legs 130 and 140 may include at least one among Cu, Ag, Al, and Ni, and may have thicknesses of 0.01 mm to 0.3 mm. In a case in which the thickness of the lower electrode 120 or upper electrode 150 is less than 0.01 mm, an electrode function thereof is degraded, and thus electric conductivity performance thereof may be lowered, and in a case in which the thickness thereof is greater than 0.3 mm, resistance thereof increases, and thus conduction efficiency thereof may be lowered.

In addition, each of the lower substrate 110 and the upper substrate 160, which face each other, may be a metal substrate, and the thickness thereof may be 0.1 mm to 1.5 mm. In a case in which the thickness of the metal substrate is less than 0.1 mm or greater than 1.5 mm, since a radiation or thermal conductivity thereof may become excessively high, the reliability of the thermoelectric element may be degraded. In addition, in the case in which the lower substrate 110 and the upper substrate 160 are the metal substrates, insulating layers 170 may be further formed between the lower substrate 110 and the lower electrodes 120 and between the upper substrate 160 and the upper electrode 150. The insulating layer 170 may include a material having a thermal conductivity of 1 to 20 W/K.

In this case, sizes of the lower substrate 110 and the upper substrate 160 may also be different. For example, a volume, thickness, or area of one of the lower substrate 110 and the upper substrate 160 may be greater than that of the other thereof. Accordingly, the heat absorption or radiation performance of the thermoelectric element can be enhanced. Preferably, at least one among the volume, the thickness, and the area of the lower substrate 110 may be greater than that of the upper substrate 160. In this case, in a case in which the lower substrate 110 is disposed in a high temperature region for the Seebeck effect or applied as a heating region for the Peltier effect, or in a case in which a sealing member for protecting the thermoelectric device, which will be described below, from the external environment is disposed on the lower substrate 110, at least one among the volume, the thickness, and the area of the lower substrate 110 may be greater than that of the upper substrate 160. In this case, the area of the lower substrate 110 may be greater than 1.2 to 5 times that of the upper substrate 160. In a case in which the area of the lower substrate 110 is less than 1.2 times that of the upper substrate 160, an effect on improving heat conduction efficiency is not high, and in a case in which the area of the lower substrate 110 is greater than 5 times that of the upper substrate 160, the heat conduction efficiency may be significantly lowered, and it may be difficult to maintain a basic shape of the thermoelectric module.

In addition, a radiation pattern, for example, an irregular pattern, may also be formed on at least one surface of the lower substrate 110 and the upper substrate 160. Accordingly, the radiation performance of the thermoelectric element can be enhanced. In a case in which the irregular pattern is formed on a surface in contact with the P-type thermoelectric leg 130 or N-type thermoelectric leg 140, a bonding property between the thermoelectric leg and the substrate can also be improved. The thermoelectric device 100 includes the lower substrate 110, the lower electrodes 120, the P-type thermoelectric leg 130, the N-type thermoelectric leg 140, the upper electrodes 150, and the upper substrate 160.

Although not illustrated in the drawings, the sealing member may be further disposed between the lower substrate 110 and the upper substrate 160. The sealing member may be disposed between the lower substrate 110 and the upper substrate 160 and disposed on side surfaces of the lower electrodes 120, the P-type thermoelectric leg 130, the N-type thermoelectric leg 140, and the upper electrodes 150. Accordingly, the lower electrodes 120, the P-type thermoelectric leg 130, the N-type thermoelectric leg 140, and the upper electrodes 150 can be sealed from external moisture, heat, contamination, and the like.

In this case, the lower substrate 110 disposed on the duct 1100 may be an aluminum substrate, and the aluminum substrate may be bonded to each of the first surface 1110 and the second surface 1120 by a TIM. Since the aluminum substrate has high thermal conduction performance, heat may be easily transferred between one surface of both surfaces of each of the thermoelectric devices 1210 and 1310 and the duct 1100 in which the first fluid flows. In addition, when the aluminum substrate and the duct 1100 in which the first fluid flows are bonded by the TIM, thermal conduction between the aluminum substrate and the duct 110 in which the first fluid flows may not be interfered with.

Referring to FIGS. 1 to 4 again, the first fluid passes through the duct 1100 in a first direction, and a gas may branch off in directions perpendicular to the first direction and parallel to the first surface 1110 and the second surface 1120. To this end, one gas guide member 1400 may be disposed on each duct 1100 or a plurality of gas guide members may be disposed on each duct 1100 in a direction in which the second fluid is introduced. For example, in a case in which the third surface 1130 of the duct 1100 is formed to face the direction in which the second fluid is introduced and the fourth surface 1140 thereof is formed to face a direction in which the second fluid is discharged, the gas guide member 1400 may be disposed at a side of the third surface 1130 of the duct 1100. Alternatively, the gas guide member 1400 may also be disposed at a side of the fourth surface 1140 of the duct 1100 according to an aerodynamic principle.

In this case, a temperature of a gas introduced into the power generating apparatus is higher than a temperature of the gas discharged after passing through the radiation fin included in the thermoelectric module of the power generating apparatus. For example, the gas introduced into the power generating apparatus may be a gas having waste heat generated by an engine of a vehicle, vessel, or the like but is not limited thereto. For example, a temperature of the gas introduced into the power generating apparatus may be 100° C. or more, preferably 200° C. or more, and more preferably 220° C. to 250° C. but is not limited thereto.

The gas guide member 1400 may be disposed above the third surface 1130 of the duct 1100 and have a shape of which a distance from the third surface 1130 is increased in a direction toward a center between both ends of the third surface 1130. For example, the gas guide member 1400 may have an umbrella or roof shape. Accordingly, the second fluid, for example, waste heat, may branch off due to the gas guide member 1400 and may be guided to come into contact with the first thermoelectric module 1200 and the second thermoelectric module 1300 disposed on both surfaces of the power generating apparatus.

Meanwhile, in one power generating apparatus 1000, a width W1 between an outer side of the first radiation fin 1220 of the first thermoelectric module 1200 and an outer side of the second radiation fin 1320 of the second thermoelectric module 1300 may be greater than a width W2 of the gas guide member 1400. In this case, the outer side of each of the first radiation fin 1220 and the outer side of the second radiation fin 1320 may mean a side opposite to a side facing the duct 1100. In this case, the first radiation fin 1220 and the second radiation fin 1320 may be formed in directions not to interfere with a gas flow. For example, each of the first radiation fin 1220 and the second radiation fin 1320 may have a plate shape extending in a second direction. Alternatively, each of the first radiation fin 1220 and the second radiation fin 1320 may also have a folded shape to form a flow passage in the second direction in which the gas flows. In this case, a maximum width W1 between the first radiation fin 1220 of the first thermoelectric module 1200 and the second radiation fin 1320 of the second thermoelectric module 1300 may mean a distance between a furthest point of the first radiation fin 1220 from the duct 1100 and a furthest point of the second radiation fin 1320 from the duct 1100, and a maximum width W2 of the gas guide member 1400 may mean a width of the gas guide member 1400 in a region closest to the third surface 1132 of the duct 1100. Accordingly, a flow of a gas introduced in the second direction may not be interfered with by the gas guide member 1400 and may be directly transferred to the first radiation fin 1220 and the second radiation fin 1320. Accordingly, since contact areas between the gas and the first radiation fin 1220 and the second radiation fin 1320 are increased, amounts of heat absorbed by the first radiation fin 1220 and the second radiation fin 1320 from the gas can be increased and electricity generation efficiency can be improved.

Meanwhile, a thermal insulating member 1700 and a shield member 1800 may be further disposed between the third surface 1130 of the duct 1100 and the gas guide member 1400 to increase a sealing effect and a thermal insulating effect between the first thermoelectric module 1200, the duct 1100, and the second thermoelectric module 1300.

Meanwhile, the gas guide member 1400, the shield member 1800, the thermal insulating member 1700, and the third surface 1130 of the duct 1100 may be coupled together, and accordingly, an air layer may be formed between gas guide member 1400 and the shield member 1800. Due to the air layer between the gas guide member 1400 and the shield member 1800, thermal insulating performance may be further improved.

Alternatively, in order to further improve the thermal insulating performance, an additional insulating member 1740 may also be further disposed between the thermal insulating member 1700 and the shield member 1800.

Alternatively, although not illustrated in the drawings, one surface of the gas guide member 1400 may also extend to have a hollow triangular shape, and accordingly, the gas guide member 1400 may be bonded to the shield member 1800.

Meanwhile, according to the embodiment of the present invention, the first thermoelectric module 1200 disposed on the first surface 1110 of the duct 1100 may be provided as a plurality of first thermoelectric modules 1200, and the second thermoelectric module 1300 disposed on the second surface 1120 of the duct 1100 may be provided as a plurality of second thermoelectric modules 1300. Sizes and the number of the thermoelectric modules may be adjusted according to a required amount of generated electricity.

In this case, at least some of the plurality of first thermoelectric modules 1200 disposed on the first surface 1110 of the duct 1100 may be electrically connected, and at least some of the plurality of second thermoelectric modules 1300 disposed on the second surface 1120 of the duct 1100 may be electrically connected. To this end, electrical wires are connected to some of the plurality of electrodes included in the thermoelectric devices and drawn out to the outside of the thermoelectric devices and the withdrawn wires may be connected to connectors disposed outside the thermoelectric devices.

Meanwhile, the electrical wires and the connectors are weak to external heat or moisture, and in a case in which the second fluid passing through the radiation fin comes into direct contact with the electrical wires and the connectors, the electrical wires and the connectors may be damaged. Accordingly, the power generating apparatus according to the embodiment of the present invention may further include a shield member for covering the electrical wires and the connectors. However, in a case in which the shield member is disposed between the thermoelectric modules, the shield member may interfere with the flow passage of the second fluid. In the embodiment of the present invention, a structure of the shield member is intended to be provided that is capable of covering the electrical wire and the connector even without interfering with the flow passage of the second fluid.

The power generating apparatus according to the embodiment of the present invention may include a first shield member 2100 disposed between two adjacent first thermoelectric modules 1200-1 and 1200-2 of the plurality of first thermoelectric modules 1200 and a second shield member (not shown) disposed between two adjacent second thermoelectric modules 1300-1 and 1300-2 of the plurality of second thermoelectric modules 1300.

FIG. 8 is a partial perspective view illustrating the power generating apparatus including the shield member according to one embodiment of the present invention, FIG. 9 is a cross-sectional view illustrating the power generating apparatus of FIG. 8, FIG. 10 is an enlarged view illustrating a vicinity of the shield member of the power generating apparatus of FIG. 8, FIG. 11 is a perspective view illustrating the shield member according to one embodiment of the present invention, and FIG. 12 is a cross-sectional view illustrating the shield member according to one embodiment of the present invention. Repeated contents which are the same as those of FIGS. 1 to 7 will be omitted. For the sake of convenience in the description, an example of only the plurality of first thermoelectric modules disposed on the first surface of the duct will be described, but the present invention is not limited thereto, and a structure, which is the same as that of the plurality of first thermoelectric modules, may also be applied to the plurality of second thermoelectric modules disposed on the second surface of the duct.

Referring to FIGS. 8 to 12, the plurality of first thermoelectric modules 1200 are disposed on the first surface 1110 of the duct 1100. Each of the plurality of first thermoelectric modules 1200 includes the thermoelectric device 1210 disposed on the first surface 1110 and the radiation fin 1220 disposed on the thermoelectric device 1210. In addition, each of the first thermoelectric modules 1200 includes electrical wires 300 drawn out from the thermoelectric device 1210 and connectors 400 connected to the electrical wires 300. In this case, the electrical wires 300 may correspond to the lead wires 181 and 182 of FIG. 6.

The electrical wires 300 drawn out from one thermoelectric device 1210-1 included in one first thermoelectric module 1200-1 and the electrical wires 300 drawn out from a thermoelectric device 1210-2 of the other first thermoelectric module 1200-2 adjacent thereto may be connected to the connectors 400.

According to the embodiment of the present invention, the first shield member 2100 may be disposed between one first thermoelectric module 1200-1 and the other first thermoelectric module 1200-2 adjacent thereto and may cover the electrical wires 300 and the connectors 400 disposed between the one first thermoelectric module 1200-1 and the other first thermoelectric module 1200-2 adjacent thereto. Accordingly, the electrical wires 300 and the connectors 400 may be disposed between the first surface 1110 of the duct 1100 and the first shield member 2100.

In this case, an insulating member 3000 may be further disposed between the first surface 1110 of the duct 1100 and the first shield member 2100. Accordingly, since insulation between the first fluid in the duct 1100 and the second fluid on the first shield member 2100 can be maintained, the electricity generation performance of the power generating apparatus can be maximized.

For example, the insulating member 3000 may be disposed between the first surface 1110 and the electrical wires 300 and the connectors 400. Alternatively, the insulating member 3000 may be disposed on the first surface 1110 and side surfaces of the electrical wires 300 and the connectors 400. In this case, the insulating member 3000 may not be disposed between the electrical wires 300 and the connector 400 and the first shield member 2100. That is, holes through which the electrical wires 300 and the connectors 400 pass may also be formed in the insulating member 3000. Accordingly, since a height of the first shield member 2100 due to the insulating member 3000 is not increased, an effect of the insulating member 3000 on a flow of the second fluid can be removed.

Accordingly, the second fluid passing through the power generating apparatus according to the embodiment of the present invention may flow to sequentially pass through the first radiation fin 1220-1 of one first thermoelectric module 1200-1 of two adjacent first thermoelectric modules 1200-1 and 1200-2, the first shield member 2100, and the second radiation fin 1220-2 of the other first thermoelectric module 1200-2 of two adjacent first thermoelectric modules 1200-1 and 1200-2. The direction in which the second fluid flows may be the second direction perpendicular to the first direction in which the first fluid is introduced and discharged from the duct 1100.

Similarly, a second shield member 2200 may be disposed between one second thermoelectric module 1300 and the other second thermoelectric module 1300 adjacent thereto and may cover the electrical wires and the connectors between one second thermoelectric module 1300 and the other second thermoelectric module 1300 adjacent thereto. Accordingly, the electrical wires and the connectors may be disposed between the second surface 1120 of the duct 1100 and the second shield member. In the present specification, for the sake of convenience in the description, the first shield member 2100 is mainly described, but a structure which is the same as a structure of the first shield member 2100 may also be applied to the second shield member 2200.

In this case, the first shield member 2100 according to the embodiment of the present invention includes a first face 2110 and a second face 2120 having a height higher than a height of the first face 2110. In addition, the first shield member 2100 may further include a third face 2130 having a height higher than the height of the first face 2110 and lower than the height of the second face 2120. In this case, the first face 2110 may be disposed at the height which is lower than or equal to that of a lower surface 1222 of the radiation fin 1220. In the present specification, the height may mean a distance in a direction perpendicular to the surface of the duct 1100 with respect to the surface of the duct 1100. In the case in which the first shield member 2100 is disposed between two adjacent first thermoelectric modules 1200-1 and 1200-2, the first face 2110 of the first shield member 2100 may be symmetrically formed between two first thermoelectric modules 1200-1 and 1200-2. Accordingly, the second fluid passing through the first radiation fin 1220-1 can be introduced into the second radiation fin 1220-2 along the first shield member 2100 in a state in which a flow thereof is not interfered with.

In addition, the third face 2130 may be disposed at the height higher than that of the electrical wire 300, and the second face 2120 may be disposed at the height higher than those of electrical wire 300 and the connector 400. For example, the second face 2120 may be disposed at a maximum height, which is less than 0.25 times, preferably less than 0.2 times, and more preferably less than 0.18 times a height difference H between the lower surface 1222 and an upper surface 1224 of the radiation fin 1220, from the lower surface 1222 of the radiation fin 1220. Accordingly, since an area, which is covered by the second face 2120, of each of the first radiation fin 1220-1 and the second radiation fin 1220-2 may be minimized, the flow of the second fluid may not be interfered with.

In this case, an area of the third face 2130 may be greater than an area of the second face 2120. That is, the second face 2120 may be formed to cover the connector 400, and an entire region excluding the first face 2110 and the second face 2120 may be the third face 2130. As illustrated in the drawings, the first face 2110 may be formed along the first radiation fin 1220-1 and the second radiation fin 1220-2. In addition, the second face 2120-1 may be formed to cover a first connector connected to the electrical wire, which is drawn out from one first thermoelectric module 1200-1 and has one polarity of a first polarity and a second polarity, and a second connector connected to the electrical wire drawn out from the other first thermoelectric module 1200-2 and having one polarity of the first polarity and the second polarity. In addition, the second face 2120-2 may be formed to cover a third connector connected to the electrical wire, which is drawn out from one first thermoelectric module 1200-1 and having the other polarity of the first polarity and the second polarity, and a fourth connector connected to the electrical wire drawn out from the other first thermoelectric module 1200-2 and having the other polarity of the first polarity and the second polarity. As described above, the second face 2120 may include a plurality of second faces 2120-1 and 2120-2 spaced apart from each other. In this case, the first connector and the second connector may be one connector or separate connectors, and the third connector and the fourth connector may be one connector or separate connectors.

In addition, an entire region excluding the first face 2110 and the second face 2120 of the first shield member 2100 may be the third face 2130. In the case in which the second face 2120 includes the plurality of second faces spaced apart from each other, the third face 2130 may be disposed between two spaced second faces 2120-1 and 2120-2. Accordingly, since an area of the second face 2120 may be minimized, the first shield member 2100 may not interfere with a gas passage from the first radiation fin 1220-1 to the second radiation fin 1220-2.

Meanwhile, according to the embodiment of the present invention, the first shield member 2100 includes a first connecting face 2140 connecting the first face 2110 and the third face 2130 and a second connecting face 2150 connecting the third face 2130 and the second face 2120.

In this case, the first connecting face 2140 may be inclined at an angle θ1 greater than 0° and less than 90°, preferably greater than 10° and less than 75°, and more preferably greater than 20° and less than 60° with respect to the first face 2110. Similarly, the second connecting face 2150 may be inclined at an angle θ2 greater than 0° and less than 90°, preferably greater than 10° and less than 75°, and more preferably greater than 20° and less than 60° with respect to the second face 2120. Accordingly, a gas passing through the first radiation fin 1220-1 may be introduced into the second radiation fin 1220-2 along the first shield member 2100 without great resistance.

Meanwhile, in the case in which the third face 2130 is disposed between two adjacent second faces 2120-1 and 2120-2, a second connecting face 2150-1 and a second connecting face 2150-2 may be symmetrically disposed to connect the third face 2130 to the second face 2120-1 and the third face 2130 to the second face 2120-2, respectively.

Hereinafter, a simulation result of a gas flow when the shield member according to the embodiment of the present invention is used will be described.

FIG. 13 is a set of a top view and a cross-sectional view illustrating a shield member according to a comparative example, FIG. 14 is a view illustrating a height difference between the shield member and a radiation fin according to the comparative example of FIG. 13, and FIGS. 15A to 15C are views illustrating a flow of a gas passing through the shield member according to the comparative example;

FIG. 16 is a set of a top view and a cross-sectional view illustrating the shield member according to the embodiment of the present invention, FIG. 17 is a view illustrating a height difference between the shield member and the radiation fin according to the embodiment of FIG. 16, and FIGS. 18A to 18C are views illustrating a flow of a gas passing through the shield member according to the embodiment of FIG. 16.

In this case, a simulation was performed under conditions in which, on the basis of the first surface 1110 of the duct 1100, a height difference between a lower surface and an upper surface of the radiation fin is 6.5 mm, and a height of a connector 400 is 3 mm, and a height of an electrical wire 300 is 2.6 mm, and a height of an insulating member is 1.4 mm, and a thickness of the shield member is 0.5 mm.

According to the comparative example of FIGS. 13 to 15, a gap between the shield member and the connector was set as 2 mm, a gap between the shield member and the electrical wire was set as 2.4 mm, and accordingly, it was seen that a fin open height of the radiation fin, that is, a height difference between an upper surface of the shield member and the upper surface of the radiation fin was 3.6 mm, a fin open area of the radiation fin, that is, an area of the open radiation fin from the upper surface of the shield member to the upper surface of the radiation fin was 55.4% of a maxim fin open area of the radiation fin, that is, an open area from the lower surface to the upper surface of the radiation fin.

According to the embodiment of FIGS. 16 to 18, a gap between the shield member and the connector was set as 1 mm, a gap between the shield member and the electrical wire was set as 0.6 mm, and accordingly it was seen that a pin open height of radiation fin from the third face was 5.4 mm, a pin open height of the radiation fin from the second face is 4.6 mm, and a fin open area of the radiation fin is 79.4% of a maximum fin open area of the radiation fin.

Accordingly, when the shield member according to the embodiment of the present invention is used, since the fin open area of the radiation fin is increased, a problem in that a gas flow is interfered with by the shield member can be minimized.

Particularly, a gas flow in a structure illustrated in FIG. 13 was simulated, FIG. 15B is an enlarged view illustrating a pressure vector of a gas flowing in a region A of FIG. 15A, and FIG. 15C is an enlarged view illustrating a pressure streamline of the gas flowing in the region A. In addition, a gas flow in a structure illustrated in FIG. 16 was simulated, FIG. 18B is an enlarged view illustrating a pressure vector of a gas flowing in a region A of FIG. 18A, and FIG. 18C is an enlarged view illustrating a pressure streamline of the gas flowing in the region A of 18A.

In FIG. 15B, a distribution of pressure vectors in a region A1 (in which the gas passes through the radiation fin) was 1.493e+005 to 1.495e+005 Pa, a distribution of pressure vectors in a region A2 (in which the gas passes through the shield member) was about 1.488e+005 Pa, and a distribution of pressure vectors in a region A3 (in which the gas passes through the radiation fin) was about 1.490e+005 Pa. In addition, in FIG. 15C, a distribution of pressure streamlines in the region A1 (in which the gas passes through the radiation fin) was 1.493e+005 to 1.495e+005 Pa, a distribution of pressure streamlines in the region A2 (in which the gas passes through the shield member) was about 1.488e+005 Pa, and a distribution of pressure streamlines in the region A3 (in which the gas passes through the radiation fin) was about 1.490e+005 Pa.

In addition, in FIG. 18B, a distribution of pressure vectors in a region A1 (in which the gas passes through the radiation fin) was 1.493e+005 to 1.495e+005 Pa, a distribution of pressure vectors in a region A2 (in which the gas passes through the shield member) was about 1.490e+005 Pa, and a distribution of pressure vectors in a region A3 (in which the gas passes through the radiation fin) was about 1.490e+005 Pa.

In addition, in FIG. 18C, a distribution of pressure streamlines in the region A1 (in which the gas passes through the radiation fin) was 1.493e+005 to 1.495e+005 Pa, a distribution of pressure streamlines in the region A2 (in which the gas passes through the shield member) was about 1.490e+005 Pa, and a distribution of pressure streamlines in the region A3 (in which the gas passes through the radiation fin) was about 1.490e+005 Pa.

Accordingly, in the case in which the shield member according to the embodiment of the present invention is used, a gas passing through two adjacent thermoelectric modules can flow more smoothly.

According to the embodiments of the present invention, a power generating apparatus with high electricity generation performance can be obtained. Particularly, according to the embodiments of the present invention, the power generating apparatus of which assembly is simple and the electricity generation performance is high can be obtained by reducing the number of using components and an occupying volume.

In addition, according to the embodiments of the present invention, the power generating apparatus of which heat conduction efficiency to a thermoelectric device is improved can be obtained. In addition, according to the embodiments of the present invention, an electricity generation capacity can be adjusted by adjusting the number of power generating apparatuses.

In addition, according to the embodiments of the present invention, an area at which a second fluid comes into contact with a radiation fin of a thermoelectric module can be maximized, and thus, electricity generation efficiency can be maximized.

While the invention has been described with reference to the exemplary embodiments thereof, it will be understood by those skilled in the art that various changes and modifications may be made therein without departing from the spirit and scope of the invention as defined by the appended claims.

What is claimed is:

1. A power generating apparatus comprising:
a duct through which a first fluid passes;
a first thermoelectric module and a second thermoelectric module disposed spaced apart from each other on a first surface of the duct;
a plurality of connectors disposed between the first thermoelectric module and the second thermoelectric module on the first surface of the duct; and
a shield member disposed between the first thermoelectric module and the second thermoelectric module on the first surface of the duct,
wherein the shield member includes a first face disposed between the first thermoelectric module and the second thermoelectric module and a plurality of second faces disposed spaced apart from each other between the first thermoelectric module and the second thermoelectric module and having heights higher than a height of the first face with respect to the first surface of the duct,
wherein the plurality of connectors is disposed between the first surface of the duct and the plurality of second faces of the shield member such that the plurality of connectors are spaced apart from the shield member,
wherein the first face of the shield member is disposed closer to the first thermoelectric module or the second thermoelectric module than the plurality of second faces,
wherein the plurality of second faces of the shield member are disposed lower than an upper surface of the first thermoelectric module and are disposed lower than an upper surface of the second thermoelectric module,
wherein the shield member further includes a third face disposed between the first face and the plurality of second faces and having a height higher than the height of the first face and lower than the heights of the plurality of second faces, a first connecting face connecting an upper surface of the first face and an upper surface of the third face and second connecting faces connecting the upper surface of the third face and an upper surface of the plurality of second faces,
wherein the first connecting face is inclined at an angle greater than 0° and less than 90° with respect to the upper surface of the first face, and
wherein the third face is disposed between two of the plurality of second faces which are spaced apart from each other.

2. The power generating apparatus of claim 1, wherein:
each of the first thermoelectric module and the second thermoelectric module includes a thermoelectric device disposed on the first surface of the duct and a radiation fin disposed on the thermoelectric device,
an electrical wire drawn out from at least one of the thermoelectric device of the first thermoelectric module and the thermoelectric device of the second thermoelectric module is connected to at least one of the plurality of connectors; and
lower surfaces of each of the plurality of second faces are disposed at a height higher than a height of the electrical wire and heights of the plurality of connectors.

3. The power generating apparatus of claim 2, wherein:
the third face is disposed at a height higher than the height of the electrical wire; and
the plurality of second faces are disposed at heights higher than the heights of the plurality of connectors.

4. The power generating apparatus of claim 3, wherein the first face of the shield member is symmetrically disposed between the first thermoelectric module and the second thermoelectric module.

5. The power generating apparatus of claim 4, wherein an area of the third face is greater than areas of the plurality of second faces.

6. The power generating apparatus of claim 5, wherein:
the second connecting faces are symmetrically disposed to connect the upper surfaces of the plurality of second faces and the upper surface of the third face.

7. The power generating apparatus of claim 2, further comprising an insulating member disposed between the first surface and a lower surface of the shield member.

8. The power generating apparatus of claim 7, wherein the insulating member is disposed on side surfaces of the electrical wire and the plurality of connectors on the first surface.

9. The power generating apparatus of claim 8, wherein the insulating member is not disposed between the electrical wire and the lower surface of the shield member and between the plurality of connectors and the lower surface of the shield member.

10. The power generating apparatus of claim 2, wherein upper surfaces of the plurality of second faces are disposed to have a maximum height, which is 0.25 times a height difference between the lower surface of the radiation fin and an upper surface of the radiation fin, from the lower surface of the radiation fin.

11. The power generating apparatus of claim 2, wherein a temperature of a second fluid sequentially passing through the radiation fin of the first thermoelectric module, an upper surface of the shield member, and the radiation fin of the second thermoelectric module is different from a temperature of the first fluid.

12. The power generating apparatus of claim 11, wherein a flow direction of the first fluid is different from a flow direction of the second fluid.

13. The power generating apparatus of claim 12, wherein the flow direction of the first fluid is perpendicular to the flow direction of the second fluid.

\* \* \* \* \*